United States Patent
Ladha et al.

(10) Patent No.: US 11,526,744 B2
(45) Date of Patent: Dec. 13, 2022

(54) MONITORING CONSTRUCTION OF A STRUCTURE

(71) Applicant: DOXEL, INC., Palo Alto, CA (US)

(72) Inventors: Saurabh Ladha, Mountain View, CA (US); Robin Singh, Mountain View, CA (US)

(73) Assignee: Doxel, Inc., Palo Alto, CA (US)

( * ) Notice: Subject to any disclaimer, the term of this patent is extended or adjusted under 35 U.S.C. 154(b) by 1223 days.

(21) Appl. No.: 15/610,310

(22) Filed: May 31, 2017

(65) Prior Publication Data
US 2018/0012125 A1  Jan. 11, 2018

Related U.S. Application Data

(60) Provisional application No. 62/360,358, filed on Jul. 9, 2016.

(51) Int. Cl.
*G06N 3/08* (2006.01)
*G01S 17/89* (2020.01)
(Continued)

(52) U.S. Cl.
CPC .............. *G06N 3/08* (2013.01); *G01S 7/4808* (2013.01); *G01S 17/89* (2013.01); *G06F 30/13* (2020.01);
(Continued)

(58) Field of Classification Search
CPC ...... G06N 3/08; G06N 3/0445; G06N 3/0454; G01S 7/4808; G01S 17/89; G06F 30/13; G06Q 50/08
See application file for complete search history.

(56) References Cited

U.S. PATENT DOCUMENTS

| | | | |
|---|---|---|---|
| 2013/0096873 A1* | 4/2013 | Rosengaus | G01C 15/002 702/151 |
| 2013/0155058 A1* | 6/2013 | Golparvar-Fard | G06T 17/00 345/419 |
| 2017/0200309 A1* | 7/2017 | Qian | G06T 17/05 |
| 2017/0220887 A1* | 8/2017 | Fathi | G06K 9/00208 |

OTHER PUBLICATIONS

Chi et al. ("Automated Object Identification Using Optical Video Cameras on Construction Sites") (Year: 2011).*

(Continued)

*Primary Examiner* — Li B. Zhen
*Assistant Examiner* — Henry Nguyen
(74) *Attorney, Agent, or Firm* — Perkins Coie LLP; Alberto Araiza

(57) ABSTRACT

Methods, apparatuses, and embodiments related to a technique for monitoring construction of a structure. In an example, a robot with a sensor, such as a LIDAR device, enters a building and obtains sensor readings of the building. The sensor data is analyzed and components related to the building are identified. The components are mapped to corresponding components of an architect's three dimensional design of the building, and the installation of the components is checked for accuracy. When a discrepancy above a certain threshold is detected, an error is flagged and project managers are notified. Construction progress updates do not give credit for completed construction that includes an error, resulting in improved accuracy progress updates and corresponding improved accuracy for project schedule and cost estimates.

22 Claims, 29 Drawing Sheets

(51) Int. Cl.
  *G01S 7/48* (2006.01)
  *G06N 3/04* (2006.01)
  *G06F 30/13* (2020.01)
  *G06Q 50/08* (2012.01)

(52) U.S. Cl.
  CPC ......... *G06N 3/0445* (2013.01); *G06N 3/0454* (2013.01); *G06Q 50/08* (2013.01)

(56) References Cited

OTHER PUBLICATIONS

Kim et al. ("Automated construction progress measurement using a 4D building information model and 3D data") (Year: 2012).*
Fard et al. ("Visualization of Construction Progress Monitoring with 4D Simulation Model Overlaid on Time-Lapsed Photographs"). (Year: 2009).*
Ibrahim et al. ("Two Approaches to BIM: A Comparative Study") (Year: 2004).*
Sepasgozar et al. ("Implementation of Rapid As-built Building Information Modelling Using Mobile Lidar") (Year: 2014).*
Burak Anil et al. ("Deviation analysis method for the assessment of the quality of the as-is Building Information Models generated from point cloud data"). (Year: 2013).*
Moisan et al. ("Building a 3D Reference Model for Canal Tunnel Surveying Using Sonar and Laser Scanning") (Year: 2015).*
Soderman et al. ("Three-dimensional environment models from airborne laser radar data") (Year: 2004).*

* cited by examiner

DOXEL | Company ABC  Week 6 (5/11/17) ▶ | ● Dashboard  🏛 Financial  🎞 Invoices  |  John ▼

Search by Cost Code | ☐ Show Pending Invoices Only | ☐ Show Positive Overrun Only

| | | Budget | | | Forecast |
|---|---|---|---|---|---|
| Cost Code | Label | Quantity at Completion | Unit | Unit Cost | Budgeted | Total |
| 01 02 03 | General Requirements | | | | | $291,343 |
| 01 30 00 | Administrative Requirements | | | | | |
| 01 31 33 01 | Drywall, Metal Studs and Fireproofing | 543 | HR | $56.83 | $30,858 | |
| 01 31 33 02 | Plumbing | 1,133 | HR | $158.46 | $89,767 | |
| 01 31 33 04 | Electrical | 486 | HR | $68.25 | $33,169 | |
| 01 50 00 | Temporary Facilities and Controls | | | | | |
| 01 56 00 | Temporary Barriers and Enclosures | | | | | |
| 01 56 13 01 | Weather protection at roof openings | 700 | LF | $22.91 | $16,037 | |
| 02 41 00 05 | Additional Demo | 1 | LS | $10,000 | $10,000 | |
| 11 00 00 | EQUIPMENT | | | | | |
| 11 70 00 | Healthcare Equipment | | | | | $148,777 |

| development:9000/#/financial | | | Dashboard | Financial | Invoices | | John ▼ |
|---|---|---|---|---|---|---|---|

Company ABC
Week 3 (5/22/17) ◀▶

☐ Show pending invoices only  ☐ Show positive overrun only

Search by Cost Code

| | | | | | Budget | | Forecast |
|---|---|---|---|---|---|---|---|
| Cost Code | Label | Quantity at Completion | Unit | Unit Cost | Budgeted | Total | |
| | LEVEL – Service Weight Gasket [ 6 ] | | | | | | |
| | LEVEL – Service Weight Gasket [ 5 ] | | | | | | |
| | 601 Coupling without Stop CxC [ 3 ] | | | | | | |
| | 606 45 Elbow CxC [ 3 ] | | | | | | |
| | 607 90 Elbow CxC [ 3 ] | | | | | | |
| | Circle | | | | | | |
| | PolyLine | | | | | | |
| | Text | | | | | | |
| | MULTILEADER | | | | | | |
| | PVC Sch 40 DWV Pipe (20ft) [ 6 ] | | | | | | |
| | PN 304 Long Sweep Fourth Bend [ 6 ] | | | | | | |
| | Brazed Joint [ 1/2 ] | | | | | | |
| | 607 90 Elbow CxC [ 1/2 ] | | | | | | |
| | Type K Hard Copper [ 1/2 ] | | | | | | |
| | PVC Sch 40 DWV Pipe (20ft) [ 2 ] | | | | | | |
| | PVC Solvent Joint [ 3 ] | | | | | | |

*FIG. 15*

DOXEL

Company ABC
Week 6 (5/11/17) ▶

● Dashboard  🏛 Financial  ▦ Invoices  |  John ▶

Invite Users

First Name

Last Name

Email Address

Role          Subcontractor ▶

Team          Electrical ▶

Website Access  ☐ Dashboard      ☐ Budget Management
                ☐ Financial      ☐ Project Settings
                ☐ Invoices       ☐ Invite Users

Send Invite

*FIG. 16*

MONITORING CONSTRUCTION OF A STRUCTURE

CROSS-REFERENCE TO RELATED APPLICATIONS

This is a non-provisional application filed under 37 C.F.R. § 1.53(b), claiming priority under U.S.C. Section 119(e) to U.S. Provisional Patent Application Ser. No. 62/360,358 filed Jul. 9, 2016, the entire disclosure of which is hereby expressly incorporated by reference in its entirety.

BACKGROUND

Constructing complex structures, such as buildings, requires the proper installation/assembly of many components. Construction workers needs to properly locate and install/assemble an incredible amount of components, such as beams, pipes, ducts, studs, walls, etc. For example, some complex structures have millions of components that need to be installed with a location accuracy of within an eighth of an inch, or even less in some cases. Unfortunately, the construction process is subject to errors, which can cause significant amounts of re-work and schedule delay. For example, a wall may be installed at a wrong location. If the error is not detected in a timely fashion, a significant amount of re-work may result. A plumber may run water lines through the improperly located wall, an electrician may run electrical wires through the improperly located wall, a carpenter may add sheetrock to the improperly located wall, etc. When the error is detected, the wall may need to be demolished and rebuilt in the proper location in order to rectify the error, and the water lines, electrical wires, sheetrock, etc. may need to be reinstalled. Such errors may cause significant schedule delays and may result in significant additional costs for the construction project. Similar issues exist in the construction of other complex structures, such as airplanes, ships, submarines, space vehicles, etc.

BRIEF DESCRIPTION OF THE DRAWINGS

FIG. 9 is an illustration of an application running on a mobile device that enables a user to upload various project-related files, consistent with various embodiments.

FIG. 10 is an illustration of an application running on a mobile device that enables a user to customize project settings, consistent with various embodiments.

FIG. 12 is an illustration of an application running on a mobile device that enables a user to review invoice-related data, consistent with various embodiments.

FIGS. 13A and 13B are illustrations of an application running on a mobile device that enables a user to submit a new invoice, consistent with various embodiments.

FIG. 14 is an illustration of an application running on a mobile device that enables a user to review invoice-related data, consistent with various embodiments.

FIG. 15 is an illustration of an application running on a mobile device that enables a user to review budget-related data, consistent with various embodiments.

FIG. 16 is an illustration of an application running on a mobile device that enables a user to invite other users to access data of or utilize the application, consistent with various embodiments.

DETAILED DESCRIPTION

Figure 1:
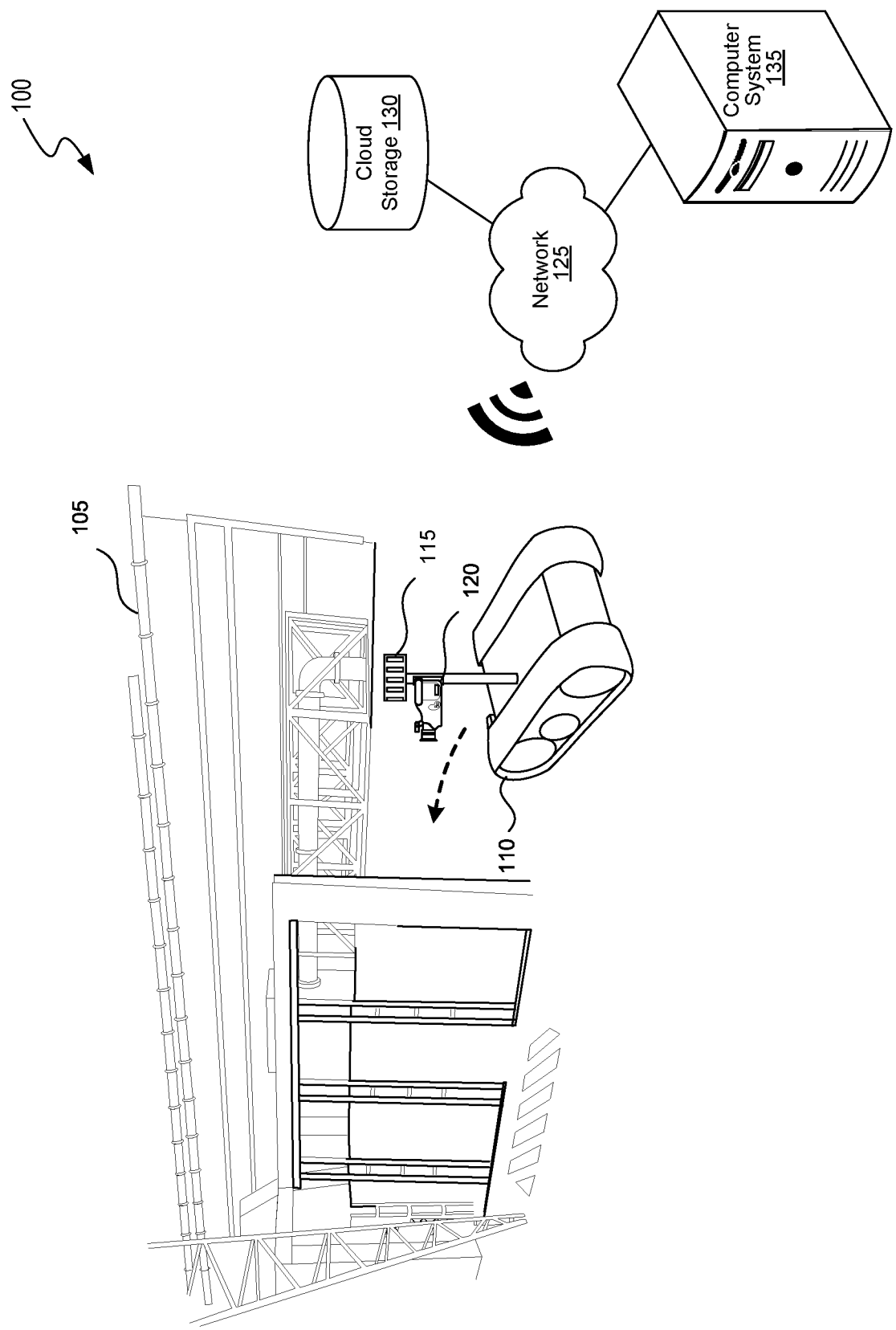
FIG. 1 is a system diagram illustrating an environment in which a construction monitoring system may be implemented, consistent with various embodiments.

Introduced here is a technique for monitoring construction of a structure, such as a building. In an example, the process of constructing a building starts with designing the building and planning the construction of the building. The process of designing the building includes capturing the design of the building via one or more computer-aided-design (CAD) applications. A CAD application can be a three dimensional (3D) CAD application, a two dimensional (2D) CAD application, among others. For example, the design of the supporting structure of the building may be captured via a 3D CAD application that supports structural analysis, such as by determining the effects of loads and stresses on structures and their components. The plumbing design may be captured via a 3D CAD application optimized for analysis and construction of plumbing components. The electrical wiring design may be captured via a 2D CAD application optimized for analysis and construction of electrical components.

While in this example the 2D CAD application used to capture the electrical wiring design is not inherently 3D, it supports the creation of a 3D view of the electrical wiring design of the building. Electrical components that are input via a 2D CAD application can be annotated with a physical attribute(s), such as elevation, depth, etc., which can be used to determine 3D locations of the components.

Once the construction project is under way, construction crews construct the building as indicated by the building design data captured by the various CAD applications. On a periodic basis, such as daily, weekly, etc., sensor data is obtained by one or more sensors based on sensor scans of the building. Physical properties of the components of the building can be determined based on the sensor data. In an example, a robot with sensors that include a LIDAR system and a video camera roams the construction site on a weekly basis. The robot uses the LIDAR system to obtain scans of all the parts of the building, and uses the video camera to obtain video images of all of the parts of the building. The sensor data from the LIDAR system is used to identify the 3D locations of the various components of the building, and the sensor data from the video camera is used to identify the colors of the various components. The sensor data is uploaded to cloud storage.

A computer system creates a 3D representation of the building design plans, referred to herein as a "3D design view," based on the building design data captured by the various CAD applications. The computer system downloads the sensor data from cloud storage and similarly creates a 3D representation of the current state of the building, referred to herein as a "3D progress view," based on the data captured by the sensor(s). The system analyzes the 3D design view and the 3D progress view to identify the various components of building depicted in the views, and maps the components of the 3D progress view to corresponding components of the 3D design view. The computer system analyzes the data to detect discrepancies between components of the two views. In the above example where the wall is installed at an incorrect location, the computer system maps the wall of the 3D progress view to a corresponding wall of the 3D design view, and determines that the installed wall is not located as indicated by the design plans. The computer system determines that the installation discrepancy is above a predetermined threshold and that the discrepancy is a reportable error, and sends a notification of the error to the project managers.

As a result of the error in the location of the wall being caught early, the error is remedied before additional work has begun, resulting in a significant reduction in the impact of the error on the schedule and costs of the construction project. By timely detecting the error, the location of the wall can be fixed before any subsequent construction involving the wall is started, resulting in avoidance of re-work of the subsequent construction. For example, by detecting the error of the location of the wall early, the wall can be fixed before any plumbing/electrical/sheetrock/etc. work that involves the wall is started.

The disclosed technique further provides improved accuracy construction progress status. In an example, during planning of a construction project, a schedule is developed. The schedule identifies project milestones, tasks that are to be completed for the milestone, and the date of completion of each project milestone. The computer system analyzes the schedule data and maps each milestone to a set of components of the 3D design view that are to be installed to accomplish the completion of the milestone. The computer system compares the components that have been properly installed against the list of components associated with the milestone, and determines how much progress has been made towards the milestone. Where the computer system detects a discrepancy in installation of a component above a threshold, the computer system does not give credit for that component being properly installed, nor does it give credit for associated components that need to be modified or removed to address the discrepancy. As a result of detecting discrepancies in a timely fashion and not giving credit for components that have been improperly installed, the disclosed technique improves upon existing progress status evaluation techniques.

The disclosed technique additionally provides for improved accuracy construction schedule and cost estimation. In the above example, when the computer system detects the discrepancy in installation of the component, not only does the computer system not give credit for the installation of the component, the computer system also determines the approximate schedule and cost impact of addressing the discrepancy. The computer system analyzes the discrepancy and determines which components need to be removed or modified to address the discrepancy, and also determines the associated schedule and cost impacts that result from the removal or modification. The computer system further analyzes the impact on subsequent tasks, and provides resulting schedule and cost impacts.

In some embodiments, the disclosed technique enables earlier detection of errors or discrepancies, improved accuracy monitoring of construction progress, and improved accuracy project schedule or cost estimations. While the examples discussed above are related to construction of a building, the technique can be similarly applied to other complex structures, such as airplanes, ships, submarines, space vehicles, etc.

The embodiments set forth below represent the necessary information to enable those skilled in the art to practice the embodiments, and illustrate the best mode of practicing the embodiments. Upon reading the following description in light of the accompanying figures, those skilled in the art will understand the concepts of the disclosure and will recognize applications of these concepts that are not particularly addressed here. It should be understood that these concepts and applications fall within the scope of the disclosure and the accompanying claims.

The purpose of terminology used herein is only for describing embodiments and is not intended to limit the scope of the disclosure. Where context permits, words using the singular or plural form may also include the plural or singular form, respectively.

As used herein, unless specifically stated otherwise, terms such as "processing," "computing," "calculating," "determining," "displaying," "generating," or the like, refer to actions and processes of a computer or similar electronic computing device that manipulates and transforms data represented as physical (electronic) quantities within the computer's memory or registers into other data similarly represented as physical quantities within the computer's memory, registers, or other such storage medium, transmission, or display devices.

As used herein, terms such as "connected," "coupled," or the like, refer to any connection or coupling, either direct or indirect, between two or more elements. The coupling or connection between the elements can be physical, logical, or a combination thereof. References in this description to "an embodiment," "one embodiment," or the like, mean that the particular feature, function, structure or characteristic being described is included in at least one embodiment of the present disclosure. Occurrences of such phrases in this specification do not necessarily all refer to the same embodiment. On the other hand, the embodiments referred to also are not necessarily mutually exclusive.

As used herein, terms such as "cause" and variations thereof refer to either direct causation or indirect causation. For example, a computer system can "cause" an action by sending a message to a second computer system that commands, requests, or prompts the second computer system to perform the action. Any number of intermediary devices may examine and/or relay the message during this process. In this regard, a device can "cause" an action even though it may not be known to the device whether the action will ultimately be executed.

Note that in this description, any references to sending or transmitting a message, signal, etc. to another device (recipient device) means that the message is sent with the intention that its information content ultimately be delivered to the recipient device; hence, such references do not mean that the message must be sent directly to the recipient device. That is, unless stated otherwise, there can be one or more intermediary entities that receive and forward the message/signal, either "as is" or in modified form, prior to its delivery to the recipient device. This clarification also applies to any references herein to receiving a message/signal from another device; i.e., direct point-to-point communication is not required unless stated otherwise herein.

As used herein, unless specifically stated otherwise, the term "or" can encompass all possible combinations, except where infeasible. For example, if it is stated that data can include A or B, then, unless specifically stated otherwise or infeasible, the data can include A, or B, or A and B. As a second example, if it is stated that data can include A, B, or C, then, unless specifically stated otherwise or infeasible, the data can include A, or B, or C, or A and B, or A and C, or B and C, or A and B and C.

FIG. 1 is a system diagram illustrating an environment in which a construction monitoring system may be implemented, consistent with various embodiments. In environment 100 of FIG. 1, robot 110 is traversing a construction site. Robot 110 navigates around building 105 and other portions of the construction site in order to obtain sensor readings related to physical properties associated with the construction project. For example, robot 110 obtains sensor readings of some or all of building 105. While a robot is used in this example, any of various methods can be utilized to obtain sensor readings related to the construction project. For example, a drone that includes a sensor can be utilized to autonomously navigate around the construction site and take sensor readings, a person with a backpack that contains a sensor can walk around the construction site and take sensor readings, etc.

In the example of FIG. 1, robot 110 traverses a path that is optimized to efficiently obtain sensor readings of all accessible portions of building 105. In some embodiments, robot 110 also traverses and obtains sensor readings of areas outside of building 105. For example, robot 110 may obtain sensor readings of landscape (to monitor development progress of landscaping), a sports facility (to monitor construction progress of, e.g., a basketball court, tennis court, pool, etc.), another building (to monitor construction progress of the other building), a parking lot or parking structure (to monitor construction progress of the parking lot or structure), etc.

As part of the construction project, a project design team, with team members such as architects, structural engineers, mechanical engineers, electrical engineers, etc., developed plans for the construction project, including design plans for the various components associated with building 105. The components can include, for example, structural beams, floors, flooring, walls, plumbing, electrical wiring, fire sprinklers, door frames and doors, external windows, internal windows, bathrooms, computer centers, surgery centers, lighting, landscaping, air conditioners, ducts, water heaters, water filtration systems, gyms, cafeterias, cabinets, closets, security systems, bulk heads, water tight doors, engines, propellers, etc. The design team captures the design of the construction project via one or more CAD applications.

Some examples of construction-related CAD applications include the following.

| Product Name | Manufacturer | Primary Function |
| --- | --- | --- |
| Cadpipe HV AC | AEC Design Group | 3D HVAC Modeling |
| Reit Architecture | Autodesk | 3D Architectural Modeling and parametric design |
| AutoCAD Architecture | Autodesk | 3D Architectural Modeling and parametric design. |
| Reit Structure | Autodesk | 3D Structural Modeling and parametric design |
| Revit MEP | Autodesk | 3D Detailed MEP Modeling |
| AutoCAD MEP | Autodesk | 3D MEP Modeling |
| AutoCAD Civil 3D | Autodesk | Site Development |
| Cadpipe Commercial Pipe | AEC Design cs. oup | 3D Pipe Modeling |
| DProftler | Beck Technology | 3D conceptual modeling with ren]- time cost estimating. |
| Bentley BINE Suite (MicroStation, Bentley Architecture, Structural, Mechanical_ Electrical, Generative Design) | Bentley Systems | 3D Architectural, Structural, Mechanical, Electrical, and Generative Components Modeling |
| Fastrak | CSC (UK) | 3D Structural Modeling |
| SDS/2 | Design Data | 3D Detailed Structural Modeling |
| Fabrication for AutoCAD MEP | East Coast CADICAM | 3D Detailed MEP Modeling |
| Digital Project Project | Technologies | CATIA based BIM System far Architectural; Design, Engineering, and Construction Modeling |
| Digital Project MEP Systems Routing | Geliry Technologies | MEP Design |
| ArchiCAD | Graphi soft | 3D Architectural Modeling |
| MEP Modeler | Graphisoft | 3D MEP Modeling |
| HydraCAD | Hydrates | 3D Fire Sprinkler Design and Modeling |
| AutoSPRENK VR | MEP_ CAD | 3D Fire Sprinkler Design and Modeling |
| FireCad | Mc4 Soil-ware | Fire Piping Network Design and Modeling |

-continued

| Product Name | Manufacturer | Primary Function |
| --- | --- | --- |
| CAD-Duct | Micro Application | 3D Detailed MEP Modeling |
| Vectorworks Designer | Nemetschek | 3D Architectural Modeling |
| Duct Designer 3D, Pipe Designer 3D | QuickPen International | 3D Detailed MEP Modeling |
| RISA | RISA Technologies | Full suite of 2D and 313 Structural Design Applications |
| Tekla Structures | Tekla | 3D Detailed Structural Modeling |
| Affinity | Trelligence | 3D Model Application for early concept design |
| Vico Office | Vico Soft-are | 5D Modeling which can be used to generate cost and schedule data |
| PowerCivil | Bentley Systems | Site Development |
| Site Design, Site Planning | Eagle Point | Site Development |

Source: FIG. 20, BIM Authoring Tools (Reinhardt, 2009)

Some CAD applications may inherently support 3D design capture and visualization, while others may not. Where 3D analysis is required and a CAD application does not inherently support 3D views, the CAD application can store data needed to generate a 3D view, such as elevation, depth, etc. of various components, which can be utilized to determine 3D locations of the components. Data derived from the design plan data, which can be or include the design plan data, can be stored at cloud storage 130, can be stored at storage local to robot 110, or can be stored at other locations.

Robot 110, having access to design plan data, is able to utilize the design plan data to generate a 3D representation of building 105, and is able to navigate around building 105 by use of the 3D representation. For example, a computer, which can be physically coupled to robot 110, or can be remote, can correlate features of building 105, as determined based on sensor readings of building 105, with features of the design plans of building 105, and can use the design plans to navigate around building 105, taking into account that the construction of building 105 is only partially complete. In some embodiments, robot 110 is able to navigate around building 105 without having access to a 3D representation of building 105. For example, the boundaries of building 105 can be input to robot 110, the coordinates of a geo-fence can be transmitted to robot 110, etc., and robot 110 can use a navigation system, such as based on global position satellites (GPS) or autonomous navigation capabilities, to traverse the various portions of building 105, or of any other area related to the construction project.

Figure 18:
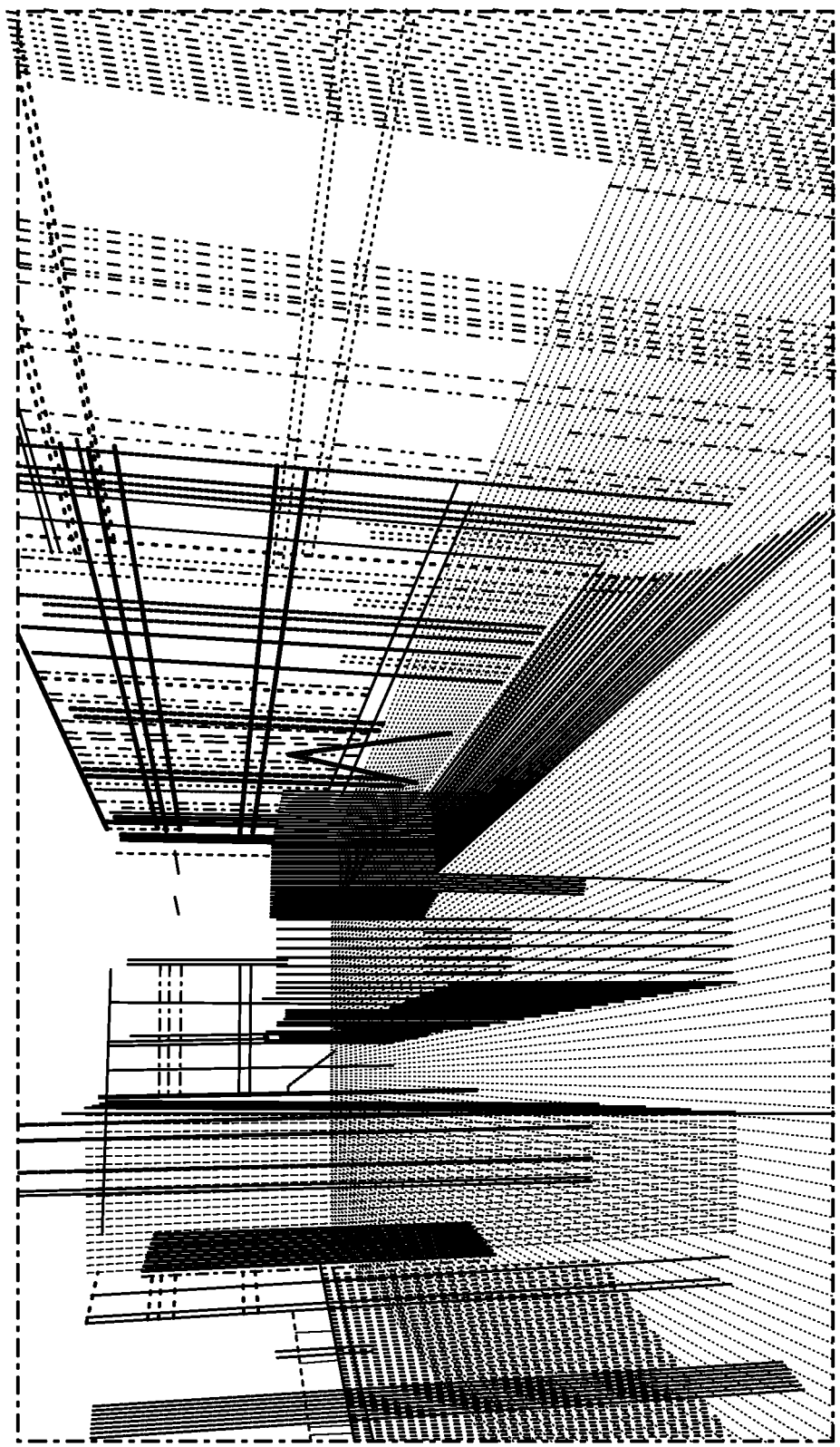
FIG. 18 is an illustration depicting a visualization of three dimensional point data, consistent with various embodiments.

As robot 110 traverses the construction site, robot 110 uses its sensors, such as LIDAR system 115 and imaging system 120, to obtain sensor readings. The sensor readings of LIDAR system 115 include 3D point cloud data, also referred to as 3D point data, from which physical properties of components related to the construction project can be derived. A portion of the 3D point cloud data includes data from which physical properties of components related to building 105, such as 3D locations of various surface points of various components of or associated with building 105, can be derived. FIG. 18 is an example of a visualization of 3D point cloud data obtained by a LIDAR system, such as LIDAR system 115.

The sensor readings of imaging system 120 includes imaging data, such as still picture or video data, from which physical properties of components related to the construction project can be derived. A portion of the imaging data includes data from which physical properties of components related to building 105 can be derived, such as the color or texture of surfaces of components, among others. Examples of components of building 105 include a pipe, beam, wall, floor, ceiling, toilet, roof, door, door frame, metal stud, wood stud, light fixture, piece of sheetrock, water heater, air conditioner unit, water fountain, cabinet, table, desk, refrigerator, sink, among others. Examples of components of landscaping include a tree, shrub, bench, mound, walkway, light fixture, sprinkler head, drainage fixtures, among others. Examples of physical properties of components include 3D locations of points on the surface of the component, the surface texture of the component, the 3D location of the component, the color of the component, the density or weight of the component, the reflectivity of the component, material type, unique identification of a component, unique identification of a material of a component, a flow rate, a gauge or thickness of a material of the component, among others.

In this example, robot 110 wirelessly transmits data derived from the sensor readings, which can be or include the raw sensor readings, to cloud storage 130 via network 125 for storage, where computer system 135 is able to access the stored data. Network 125 can be or can include the Internet. In some embodiments, robot 110 stores the data derived from the sensor data at storage local to robot 110, where computer system 135 is able to access the data. In some embodiments, computer system 135 is local to robot 110.

Figure 7A:
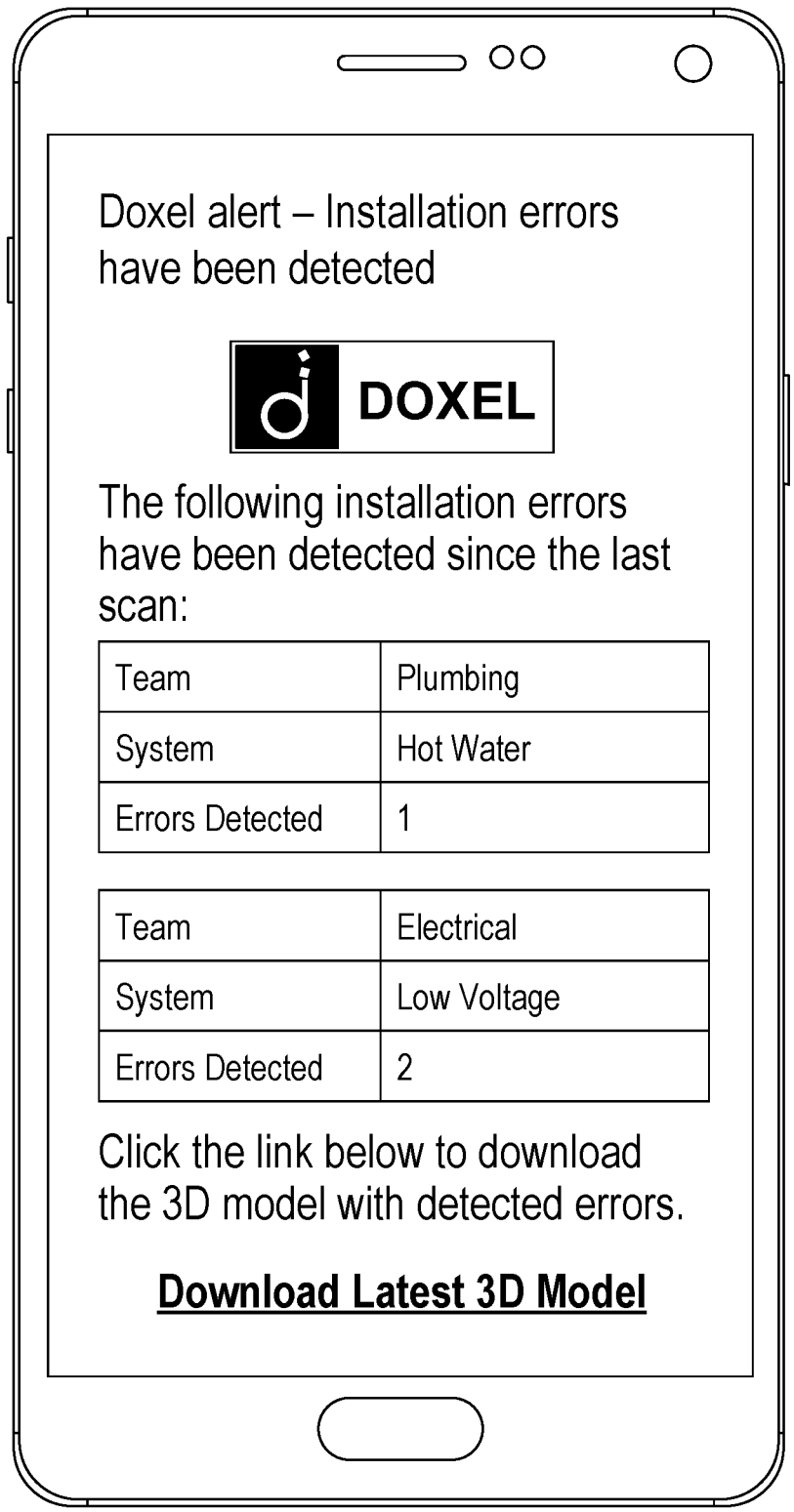
FIG. 7A is an illustration of an application running on a mobile device that provides an error notification alert, consistent with various embodiments.
Figure 7B:
FIG. 7B is an illustration of an application running on a mobile device that provides a messaging system for reporting errors, consistent with various embodiments.

Computer system 135 accesses the data stored at cloud storage 135 or at local storage. Computer system 135 creates a 3D design view based on the design plan data and identifies the various components of the 3D design view. Computer system 135 creates a 3D progress view based on the sensor data and identifies the various components of the 3D progress view. Computer system 135 maps components of the 3D progress view to corresponding components of the 3D design view, and analyzes the data to detect physical discrepancies between the two views. In some embodiments, when the discrepancy is above a predetermined threshold, the discrepancy is reported as an error. FIGS. 7A and 7B provide examples of interfaces for reporting errors. FIG. 7A is an illustration of an application running on a mobile device that provides an error notification alert. FIG. 7B is an illustration of an application running on a mobile device that provides a messaging system that supports error reporting.

Physical discrepancies can include, for example, a 3D progress view component being located at a different location as compared to its corresponding 3D design view component, being of a different dimension as compared to its corresponding 3D design view component, being of a different color as compared to its corresponding 3D design view component, being comprised of a different material as compared to its corresponding 3D design view component, having a different surface texture as compared to its corresponding 3D design view component, being a different component as compared to its corresponding 3D design view component (e.g., being a 45 degree angle joint as compared to a 90 degree angle joint, being an a brand one air conditioning unit as compared to a brand 2 air conditioning unit, being an iron pipe as compared to a copper pipe, etc.). In some embodiments, the difference may need to be above a predetermined threshold to be considered a reportable discrepancy (e.g., a location error in excess of ⅛ of an inch). In some cases, the threshold, also sometimes referred to as accuracy tolerance, is input by the design team or by other methods as annotations on the components of the design plans. For example, a pipe may have an accuracy tolerance of ⅛ of an inch, and that tolerance may be added as an annotation on the pipe via a CAD application used to create design plan data. When the discrepancy between the location of the component in the 3D design view and the 3D progress view is greater that the accuracy tolerance, the discrepancy can be reported as an error.

Computer system 135 is able to detect other types of discrepancies. In some embodiments, the data stored at cloud storage 135 includes schedule data or other performance metrics. Computer system 135, based on the above mapping and analysis, is able to determine which components have been properly installed, which have not been installed at all or have been only partially installed, or which have been installed incorrectly. Based on this analysis, computer system 135 is able to detect various other types of discrepancies. For example, computer system 135 can detect a discrepancy between progress projected by a schedule and actual progress (e.g., progress as determined based on an analysis of components of the 3D progress view, giving credit for those components that have been properly installed, and not giving credit for components that have discrepancies that need to be addressed).

Figure 8A:
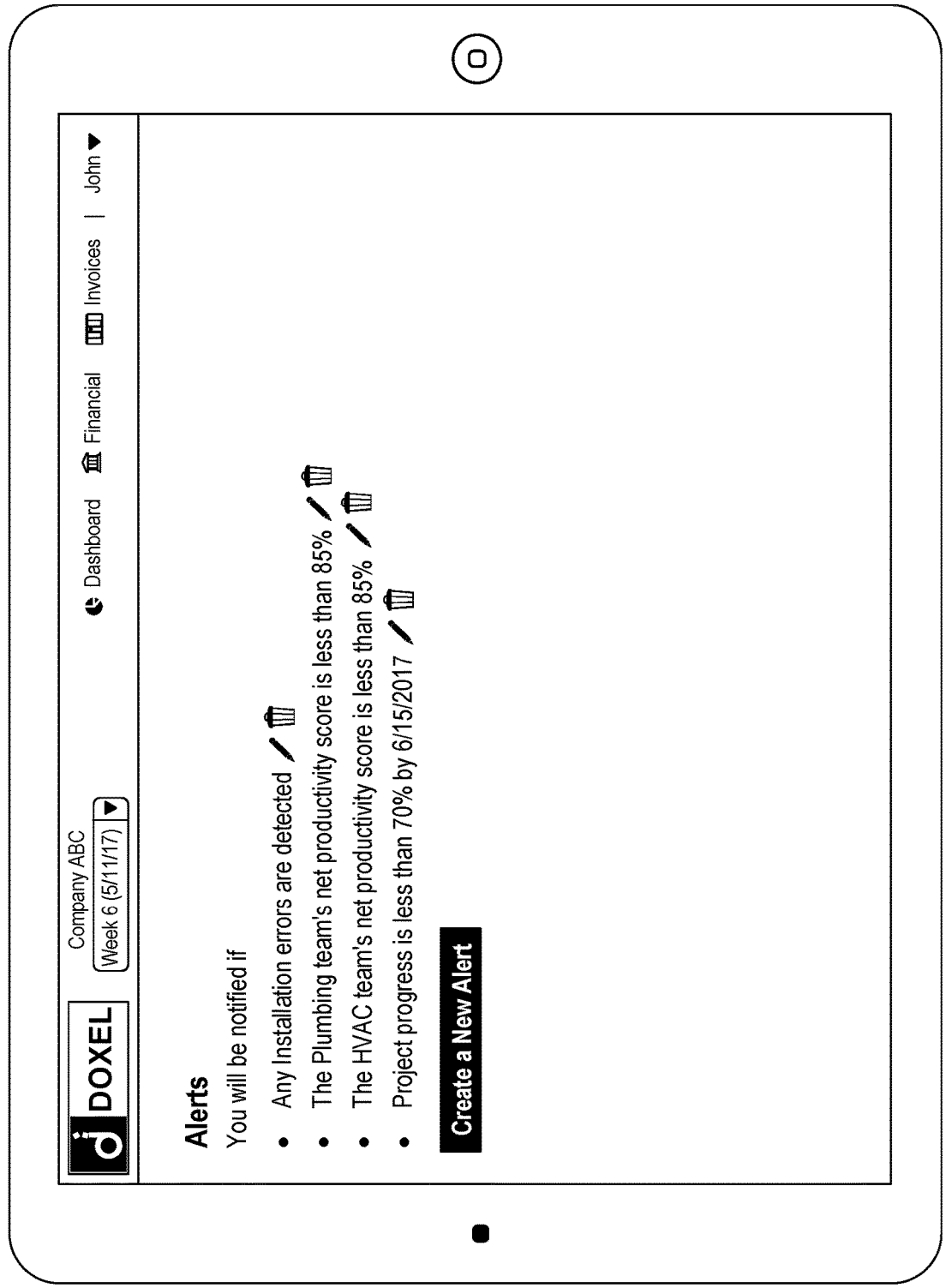
FIG. 8A is an illustration of an application running on a mobile device that enables a user to set alert notification parameters, consistent with various embodiments.
Figure 8B:
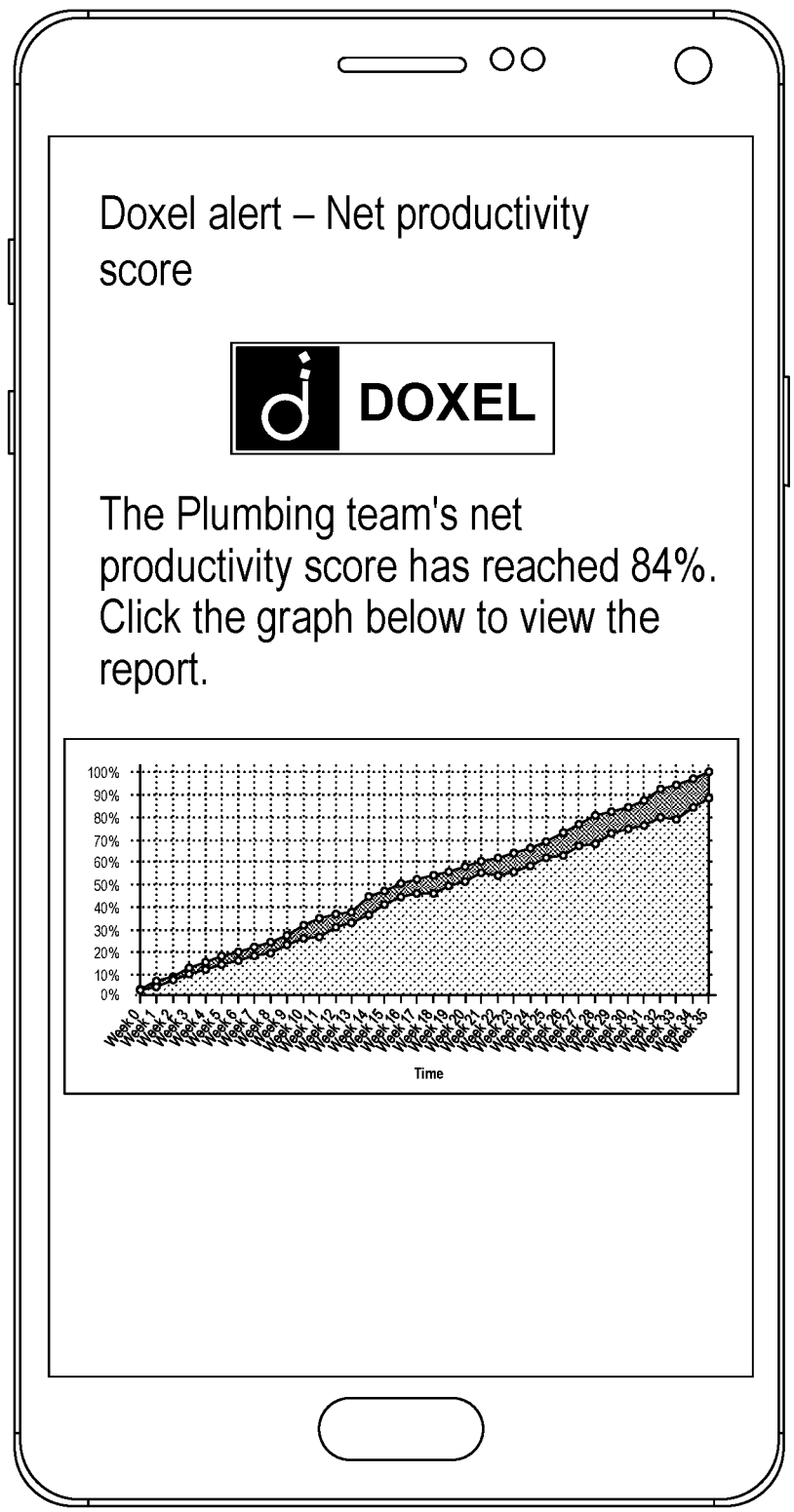
FIGS. 8B and 8C are illustrations of an application running on a mobile device that provides an alert when a productivity level falls below a threshold, consistent with various embodiments
Figure 8C:
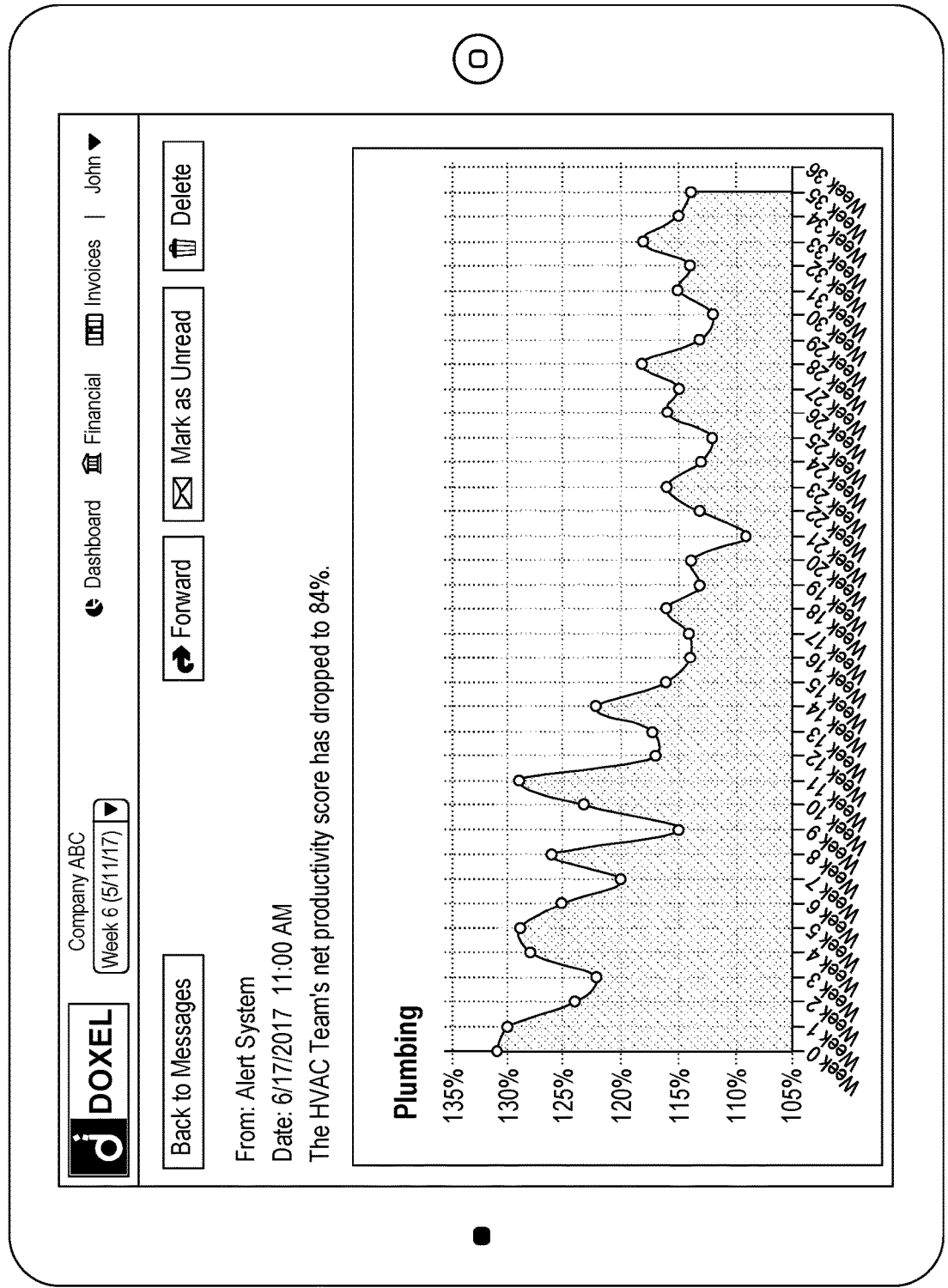

As another example, computer system 135 can detect a discrepancy between a planned or targeted productivity level and an actual productivity level. FIGS. 8A-C provide examples of alerts being displayed for other types of discrepancies. FIG. 8A is an illustration of an application running on a mobile device that enables a user to set alert notification parameters, including setting an alert for a planned or targeted productivity level/score, or setting an alert for a planned progress. FIGS. 8B and 8C are illustrations of an application running on a mobile device that provides an alert when a discrepancy is detected between a planned or targeted productivity level/score and an actual productivity level/score.

Figure 4:
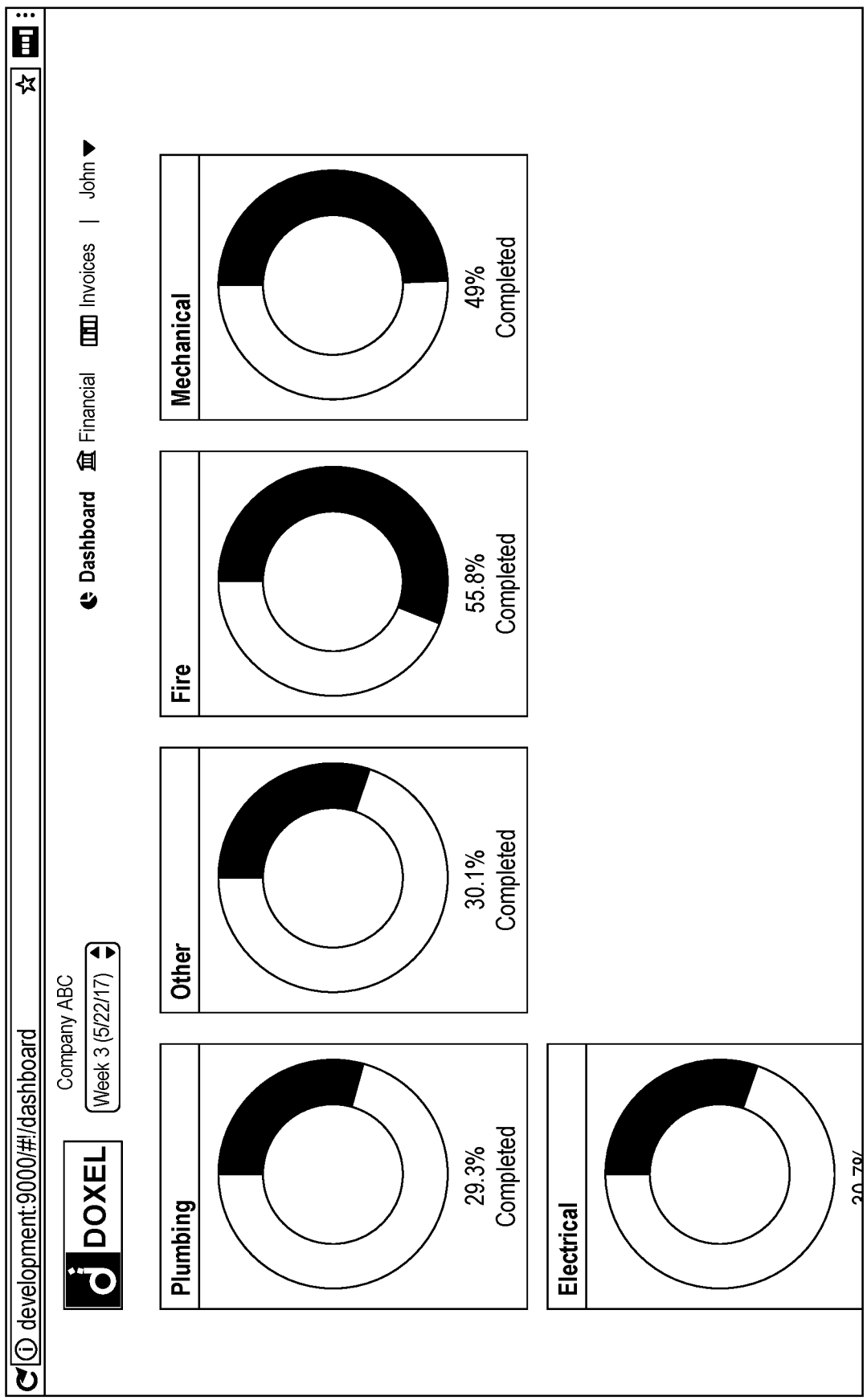
FIG. 4 is an illustration of a web interface that provides a milestone progress status for several groups of tasks of a construction project, consistent with various embodiments.
Figure 5:
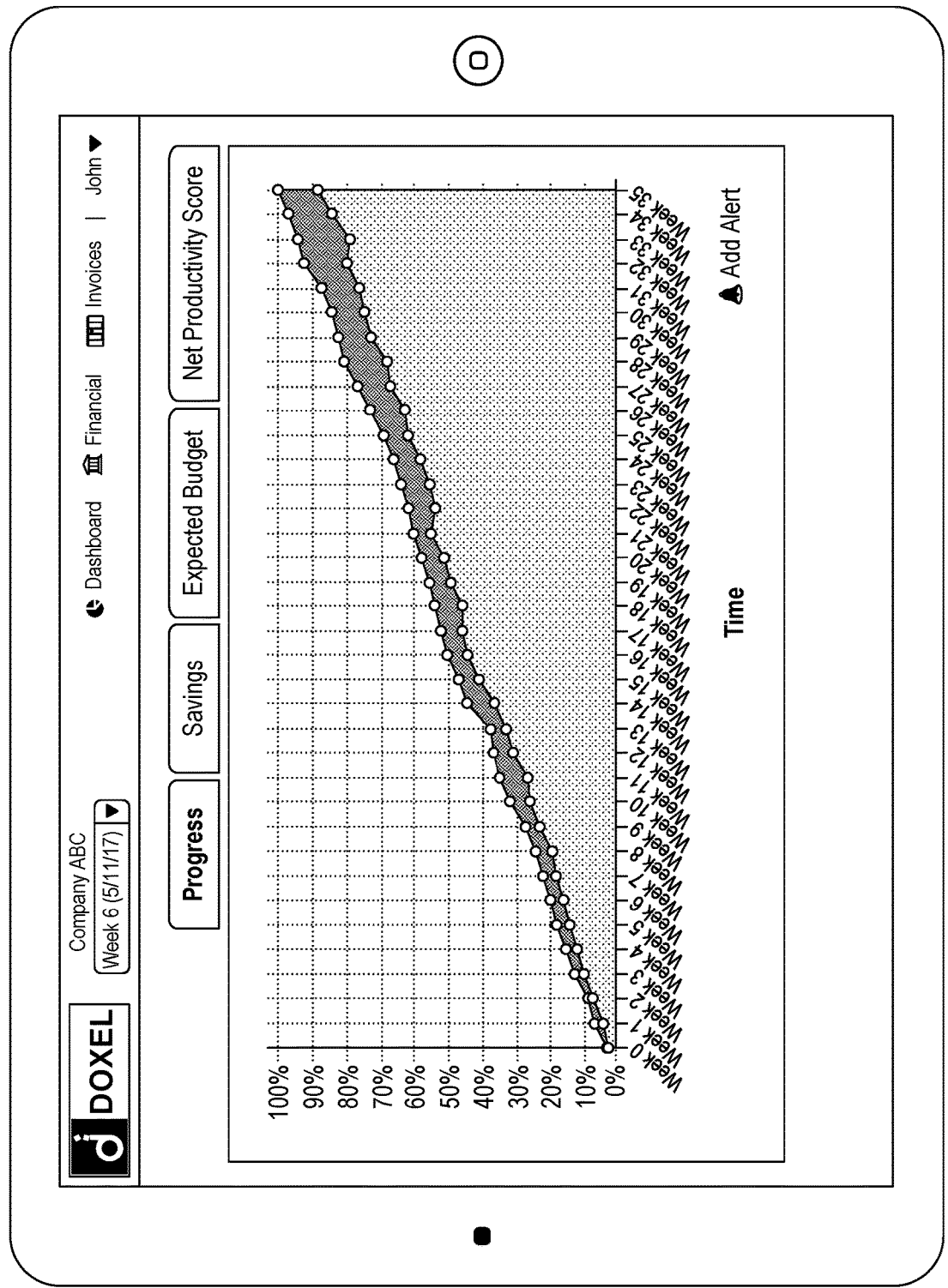
FIG. 5 is an illustration of an application running on a mobile device that provides historic progress towards a project milestone, consistent with various embodiments.

Based on the above analysis, mapping, and discrepancy detection, computer system 135 is able to provide construction progress status. FIGS. 4 and 5 provide examples of interfaces for providing construction progress status. FIG. 4 is an illustration of a web interface that provides a milestone progress status for several groups of tasks of a building construction project. FIG. 5 is an illustration of an application running on a mobile device that provides historic progress towards a project milestone. As previously mentioned, the construction progress status does not provide credit for components that have discrepancies that need to be addressed.

Figure 2:
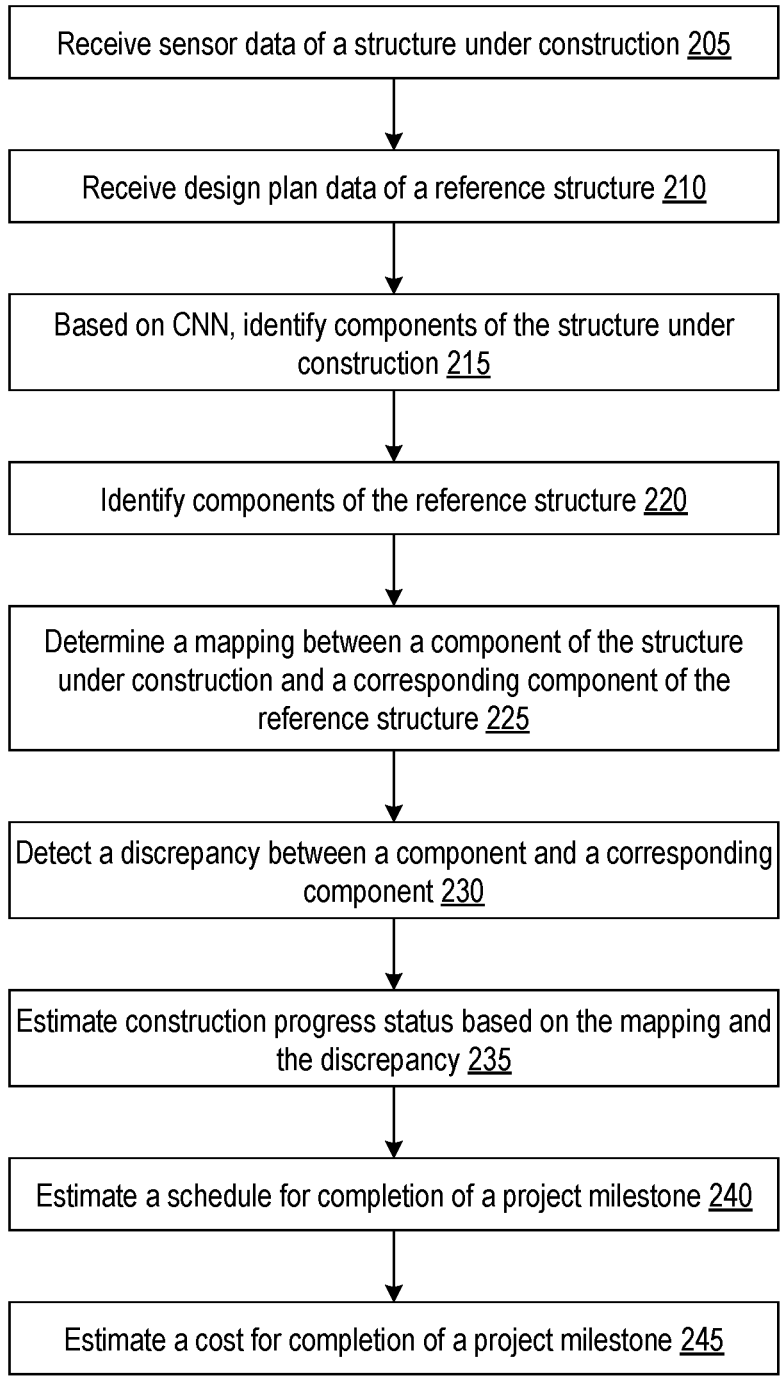
FIG. 2 is a flow diagram illustrating an example process of monitoring progress of a construction project, consistent with various embodiments.

FIG. 2 is a flow diagram illustrating an example process for monitoring progress of construction of a structure, consistent with various embodiments. At block 205, a computer system receives data derived from sensor readings related to a structure under construction. Sensor readings, also referred to as sensor reading data or sensor data, are data generated by a sensor based on environmental properties that are detected by the sensor. The sensor can be any type of sensor from which physical properties related to an environment, such as environment 100 of FIG. 1, can be determined. Examples of sensors include a LIDAR device, an imaging device (e.g., a camera, a video camera, a mobile device, etc.—examples of mobile devices include a smartphone, a portable media device, a tablet computer, a laptop computer, a wearable device, etc.), a sonar device, a radar device, a humidity measuring device, a reflectivity measuring device, a temperature measuring device, a sound measuring device, a density measuring device, a chemical measuring device, a depth sensor, a Kinect sensor, among others. The structure can be any complex structure, such as a building, an airplane, a ship (e.g., a container ship, an aircraft carrier, a warship, an oil tanker, etc.), a submarine, a space vehicle (which can be or can include a space launch vehicle), among others. The data derived from sensor readings can be or can include the raw sensor reading data, or can include data that is generated based on processing of the sensor reading data.

The sensor data can be obtained in any appropriate way. For example, the sensor data can be obtained by a robot with one or more sensors that roams a construction site related to a structure, by a drone with one or more sensors that flies around a construction site related to a structure, by a person with one or more sensors that walks around a construction site related to a structure, by an autonomous vehicle with one or more sensors that navigates around a construction site related to a structure, etc. The robot/drone/autonomous vehicle/etc. can utilize data derived from design plan data related to the structure, or other available data, such as map data, to navigate the environment associated with the structure. As the robot/drone/autonomous vehicle/person/etc. is traversing the environment with the one or more sensors, sensor readings of the environment are obtained. The sensor data can be obtained any number of times and at any frequency. For example, the sensor data can be obtained once, can be obtained daily, can be obtained weekly, can be obtained whenever a particular piece of equipment, such as a robot or a sensor, is available, can be obtained whenever a particular person is available and the weather is acceptable, can be obtained sporadically, etc. The sensor data can be of any needed completeness. For example, the sensor data can be of one portion of a structure, such as one room of a building, can be of an entire structure, can be of an entire structure and some amount of surrounding environment, etc.

At block 210, the computer system receives data derived from design plan data of a reference structure. The reference structure can be, for example, a model of a structure captured by a CAD application during the design and planning of the construction of the structure, and that represents the intended physical state of the structure once construction is complete. In an example where the structure is a building, the reference structure is the model of the structure represented by the design plan data that was captured by the design team by use of one or more CAD applications during the design and planning of the construction of the structure.

At block 215, based on a convolution neural network (CNN), the computer system identifies components related to the structure under construction. Neural networks, including some techniques for generating, training, and using neural networks, are well known in the art, as is evidenced by the following references: Ian Goodfellow, Yoshua Bengio & Aaron Courville, *Deep Learning* (2016); Alex Krizhevsky, Ilya Suskever & Geoffrey E. Hinton, *ImageNet Classification with Deep Convolutional Neural Networks* (2012);

Ali Sharif Razavian, Hossein Azizpour, Josephine Sullivan & Stefan Carlsson, *CNN Features off-the-shelf: an Astounding Baseline for Recognition* (last rev. May 12, 2014); Charles R. Qi, Hao Su, Kaichun Mo & Leonidas J. Guibas, *PointNet: Deep Learning on Point Sets for 3D Classification and Segmentation* (last rev. Apr. 10, 2017); Sepp Hochreiter & Jürgen Schmidhuber, *Long Short-Term Memory*, 9 Neural Computation 1735 (1997); TensorFlow, *Recurrent Neural Networks* (last updated Mar. 8, 2017); and John D. Lafferty, Andrew McCallum & Fernando C. N. Pereira, *Conditional Random Fields: Probabilistic Models for Segmenting and Labeling Sequence Data* (2001). The CNN was generated and trained prior to execution of block 210 (the generation and training of the CNN will be discussed related to a following figure). While a CNN is used in this example, any type of machine learning system or the like can be utilized by the technique.

The computer system analyzes, by use of the CNN, the data received at block 205 and identifies components based on physical properties associated with the component that can be determined based on the received data. In an example where the structure is a building and the sensor is a LIDAR device, the data received at block 205 is 3D coordinate data from which surface locations of various components or other objects associated with the building can be determined. Some or all of the components of or associated with the structure are identified by use of the trained CNN. In some embodiments, when the computer system is not be able to identify some components, the identification of some or all of the unidentified or ambiguous components is done by a human. For example, the computer system can generate a list of ambiguous components and that list can be provided to one or more humans, who view a representation of the sensor data, such as by viewing data similar to the data of FIG. 18 or FIGS. 20A-D, and manually identify the components, such as by adding a label to each component that he identifies.

At block 220, the computer system identifies components related to the reference structure. In some embodiments, the design plan data of the reference structure includes labels for some or all of the components. When a component is labeled, the computer system can identify the component based on the label. For example, a structural engineer may input a structural beam by use of a CAD application during the design of the structure, and may label the structural beam as a "structural beam" in the CAD application, or the CAD application may automatically label the structural beam. In some embodiments, when some or all components of the reference structure do not have labels, the computer system can analyze data derived from the design plan data to identify the non-labeled components of the reference structure, such as by use of techniques similar to those previously discussed (e.g., a CNN, a human, some other technique, etc.).

Figure 9:
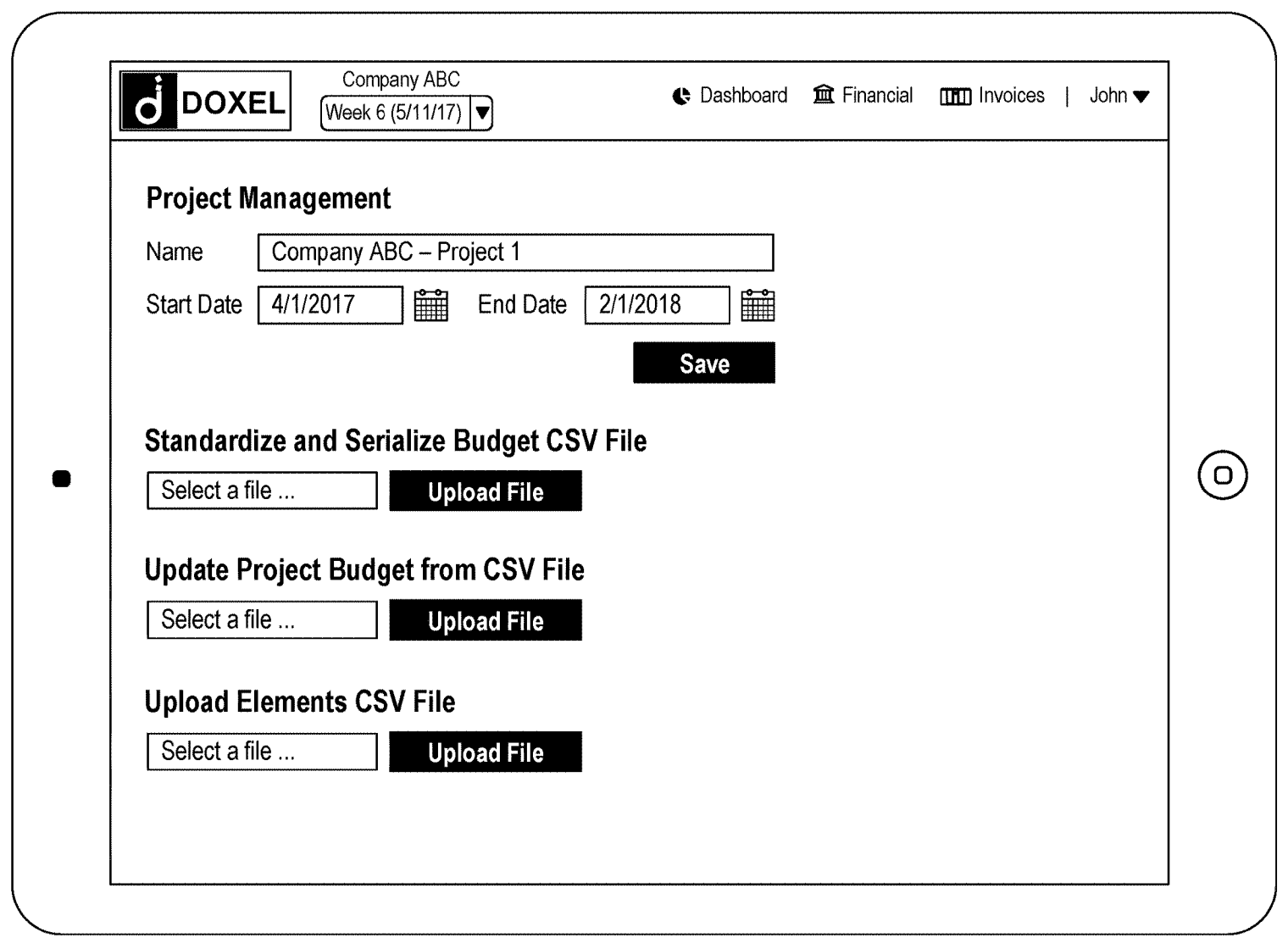

In an example, the computer system reads the design plan data and generates data derived from the design plan data that is compatible with the CNN. The computer system then identifies some or all of the non-labeled components by use of the trained CNN. In some embodiments where the computer system is not able to identify some components, the identification of some or all of the unidentified components is done by a human. In some embodiments, components are labeled via a reference file. For example, FIG. 9 is an illustration of an application running on a mobile device that enables a user to set upload various project-related files, such as an elements csv file. The elements csv file can include labels for various components (also referred to as elements), and information that enables the computer system to map the label data to a corresponding component of the design plan data or sensor data. FIGS. 20A-D are illustrations depicting visualizations of data derived from sensor readings of a building after components associated with the building have been identified.

Figure 19A:
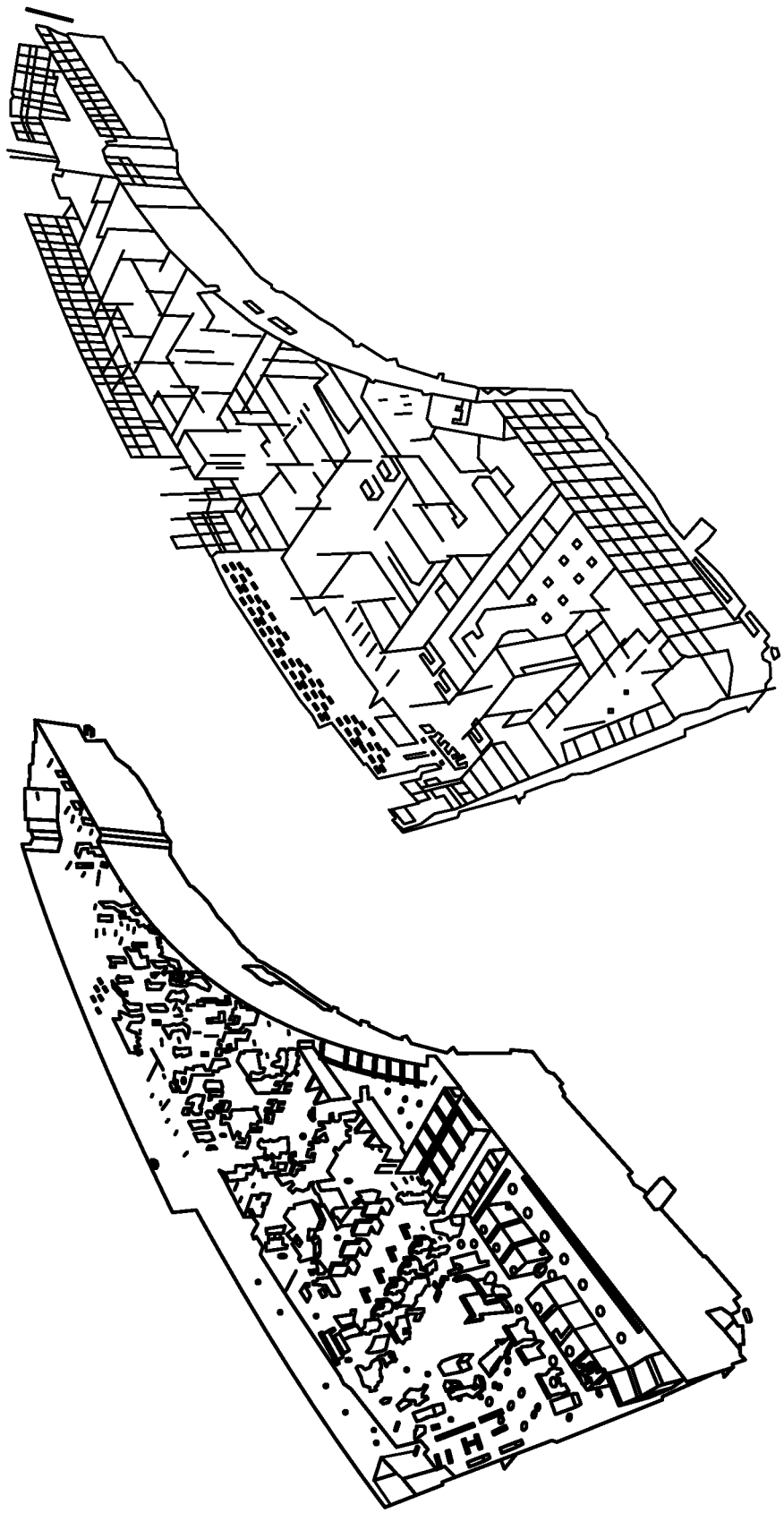
FIGS. 19A-C are illustrations depicting aligning data derived from a model of a building and sensor data derived from a sensor reading of a building, consistent with various embodiments.
Figure 19B:
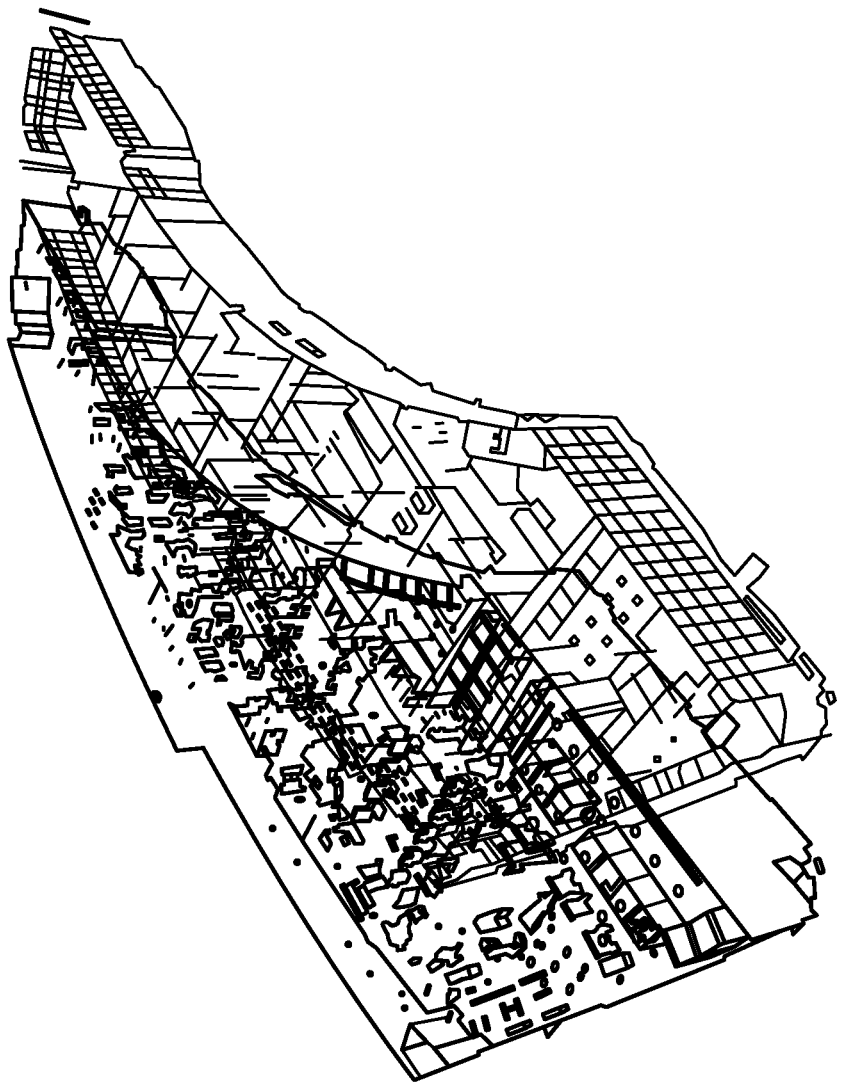
Figure 19C:
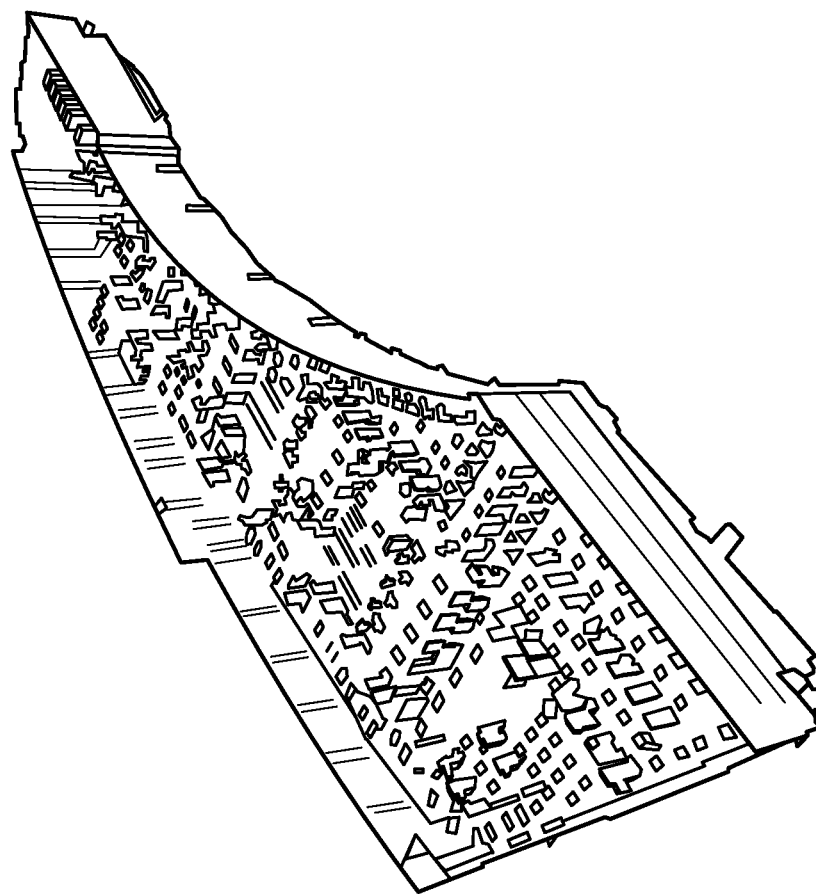
Figure 20A:
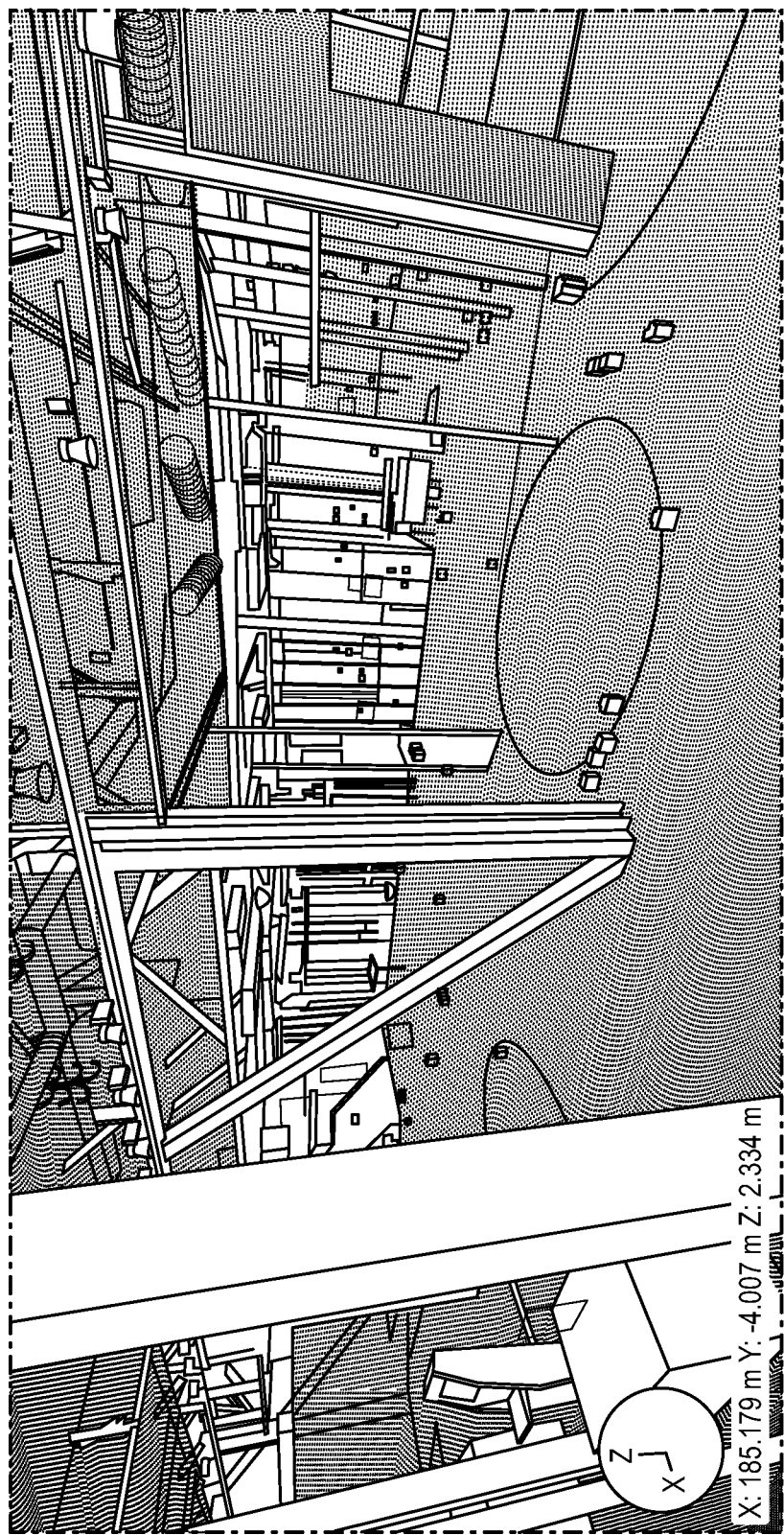
FIGS. 20A-D are illustrations depicting visualizations of data derived from sensor readings of a building after components associated with the building have been identified, consistent with various embodiments.
Figure 20B:
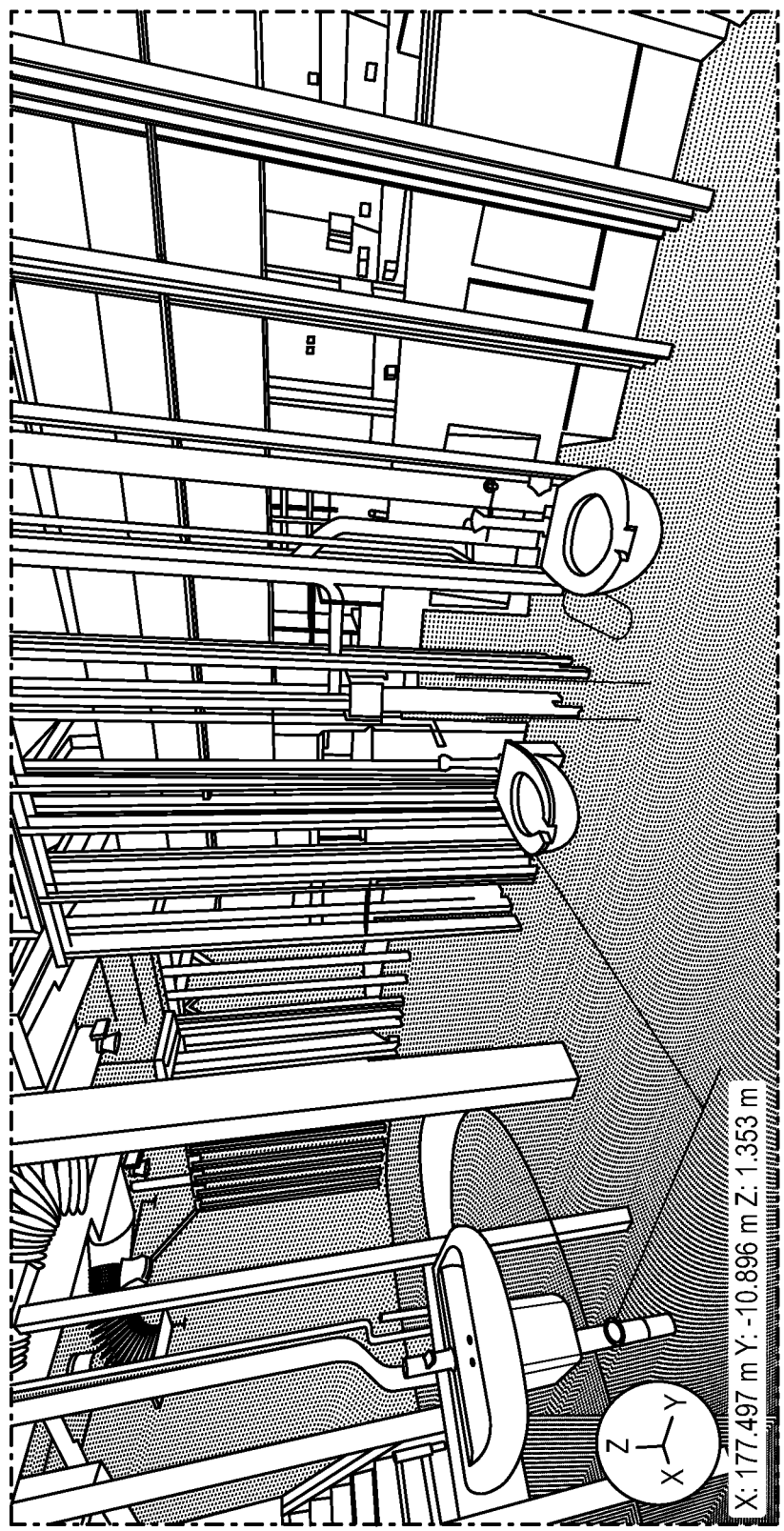
Figure 20C:
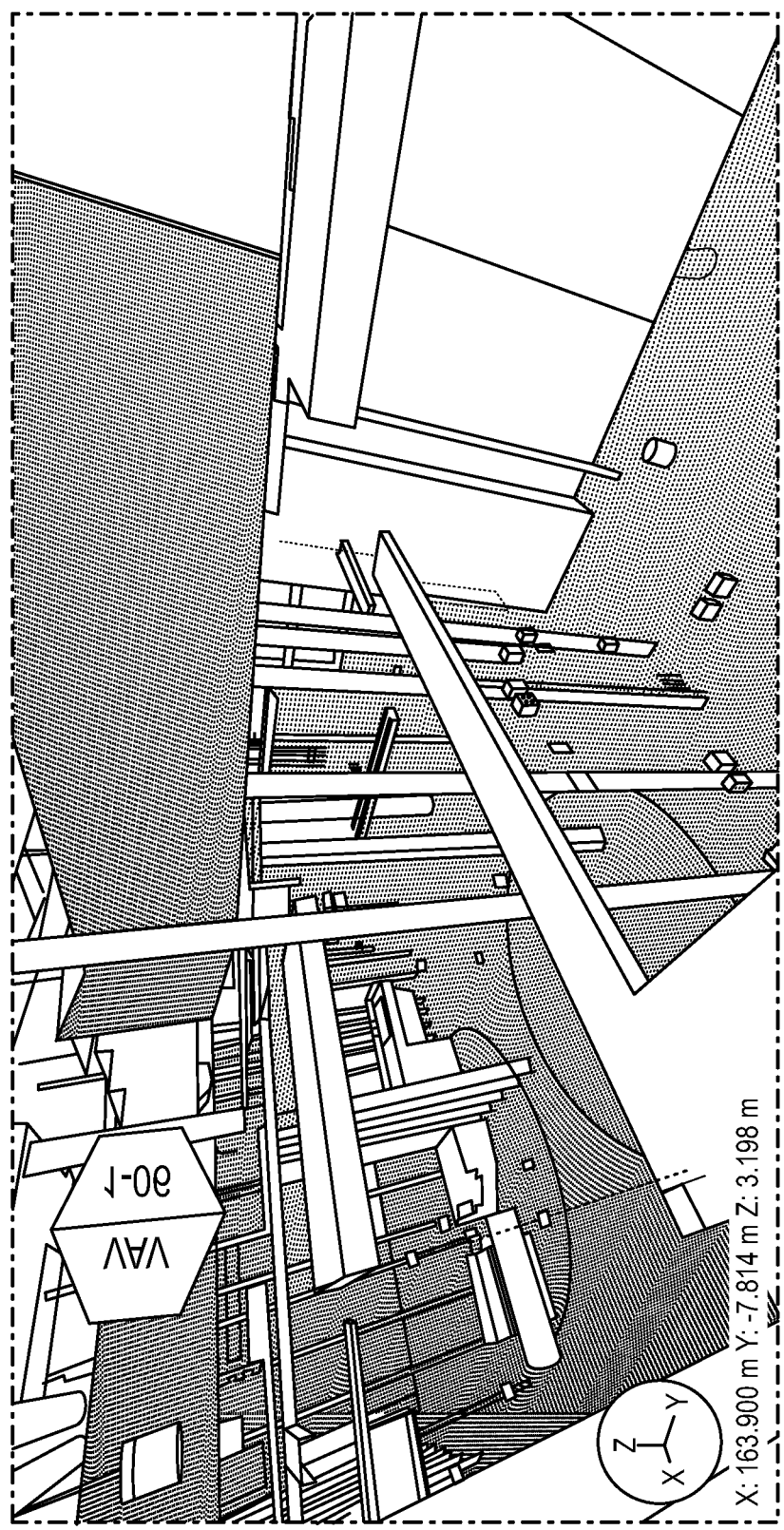
Figure 20D:
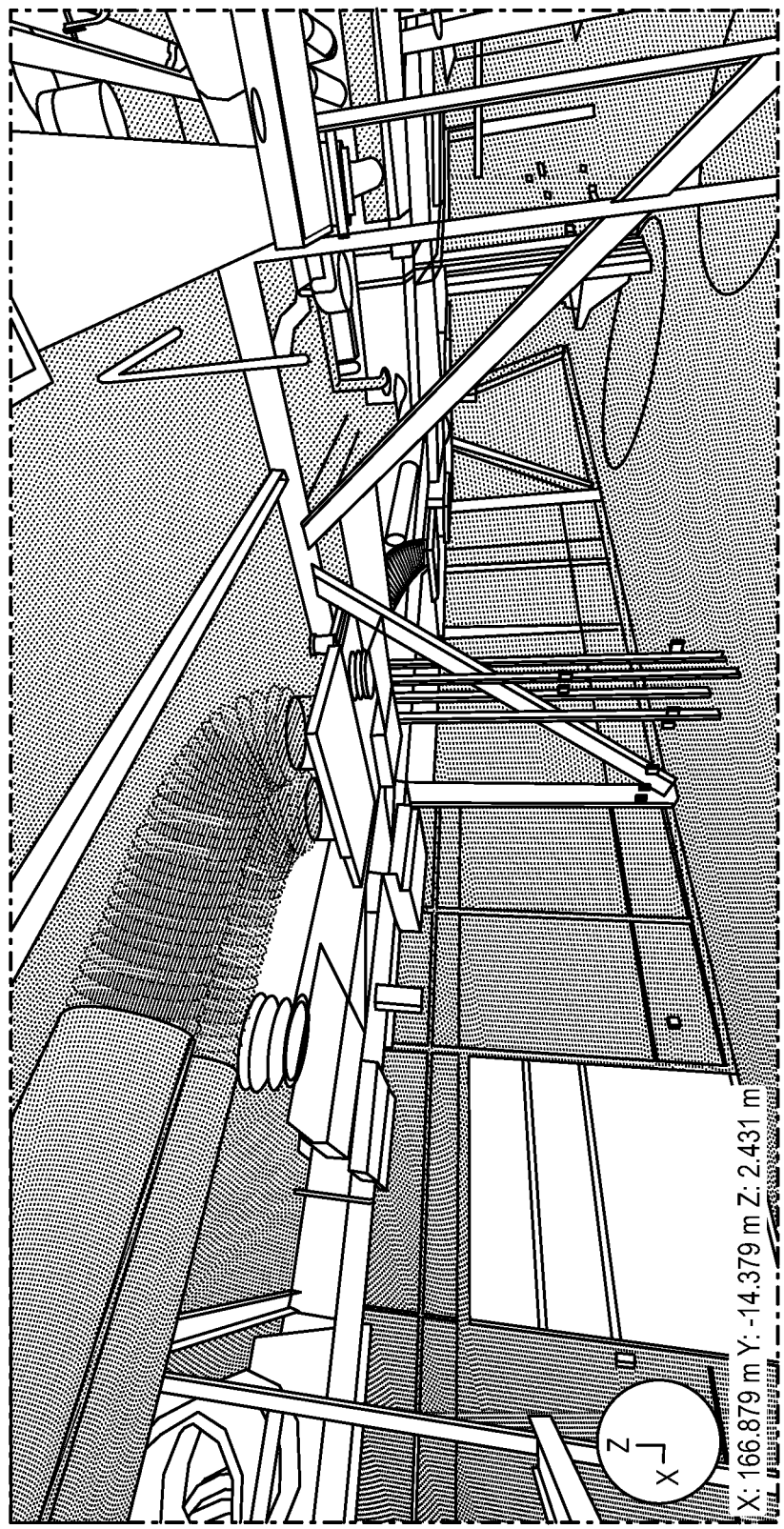

At block 225, the computer system determines a mapping between a component of the structure under construction and a corresponding component of the reference structure. In an example, the computer system compares data of the structure under construction to data of the reference structure in order to determine an alignment of the two data sets, such as by matching exterior walls and determining an alignment that causes the external walls of the two structures to be aligned. FIGS. 19A-C are illustrations depicting aligning data derived from a model of a building, such as the reference structure, and sensor data derived from a sensor reading of a building, such as a building under construction. FIG. 19A depicts two views, a view of a reference structure and a view of a structure under construction. FIG. 19B depicts the two views as they conceptually begin to be aligned, and FIG. 19C shows the two views after alignment. FIGS. 19A-C are conceptualizations of the alignment process, and may not reflect how the computer system actually aligns the views (e.g., the computer system may not incrementally move the two views closer together).

The computer system next begins to identify corresponding components of the two structures. In an example, the computer system identifies a first wall at a particular location with certain dimensions in the structure under construction, and identifies a second wall at the same particular location with the same dimensions in the reference structure, and maps the first wall and the second wall. In another example, the computer system identifies a third wall at a particular location with certain dimensions in the structure under construction, and identifies a fourth wall of the reference structure that is located at a slightly different position than the third wall, and that has the same dimensions. The computer system decides that the two walls are sufficiently similar to indicate a high likelihood of being corresponding walls, and maps the third wall and the fourth wall. In some embodiments where the computer system is not able to map some of the components, the mapping of some or all of the unmapped components is done by a human.

At block 230, the computer system detects a discrepancy between a component of the structure under construction and a corresponding component of the reference structure. The discrepancy detected can be any of various types of discrepancies. In some embodiments, the discrepancy is a physical discrepancy. Examples of physical discrepancies include a structure under construction component being located at a different location as compared to its corresponding reference structure component, being of an different dimension as compared to its corresponding reference structure component, being of a different color as compared to its corresponding reference structure component, being comprised of a different material as compared to its corresponding reference structure component, having a different surface texture as compared to its corresponding reference structure component, being a different component as compared to its corresponding reference structure component (e.g., being a 45 degree angle joint as compared to a 90 degree angle joint, being an a brand one air conditioning unit as compared to a brand 2 air conditioning unit, being an iron pipe as compared to a copper pipe, etc.), etc.

In some embodiments, the difference may need to be above a predetermined threshold to be considered a reportable discrepancy, also sometimes referred to as an error (e.g., a location discrepancy in excess of ⅛ of an inch is determined to be a reportable discrepancy or error). In some cases, the threshold, or accuracy tolerance, is input by the design team or by other methods as annotations on the components of the design plans. For example, a pipe may have an accuracy tolerance of ⅛ of an inch, and that tolerance may be added as an annotation or label on the pipe. When the discrepancy between the location of the component in the reference structure and the structure under construction is greater that the accuracy tolerance, the discrepancy can be reported as an error.

At block 235, the computer system estimates construction progress status based on the mapping and the discrepancy. With current systems, when a construction contractor, such as a drywall company, reports progress status, the report often gives credit for completed construction that has unacceptable levels of error due to an error being undetected. Further, since payments are made based on construction progress, once a payment is made for completing a portion of construction, and an error is later detected, the incentive for the construction contractor to rectify the error is reduced due to the construction contractor having already received payment for the construction.

With the disclosed technique, a discrepancy can be detected much earlier, such as upon obtaining sensor data for the structure under construction. When the discrepancy meets a certain criteria, such as being significant enough to cause additional work or re-work, the discrepancy can be reported as an error. With the disclosed technique, even though some amount of construction has been completed, when the completed construction includes an error, no credit may be given for the completed construction that includes the error. As a result, construction progress status will flag that some completed construction includes an error, and the construction progress status will not give credit for the completed construction that includes the error. The construction contractor will resultantly receive no progress payment for the construction that includes the error, and will have to fix the error before a progress payment will be made. The construction company is incentivized to fix the error due to a progress payment being held up until the error is fixed.

Figure 13A:
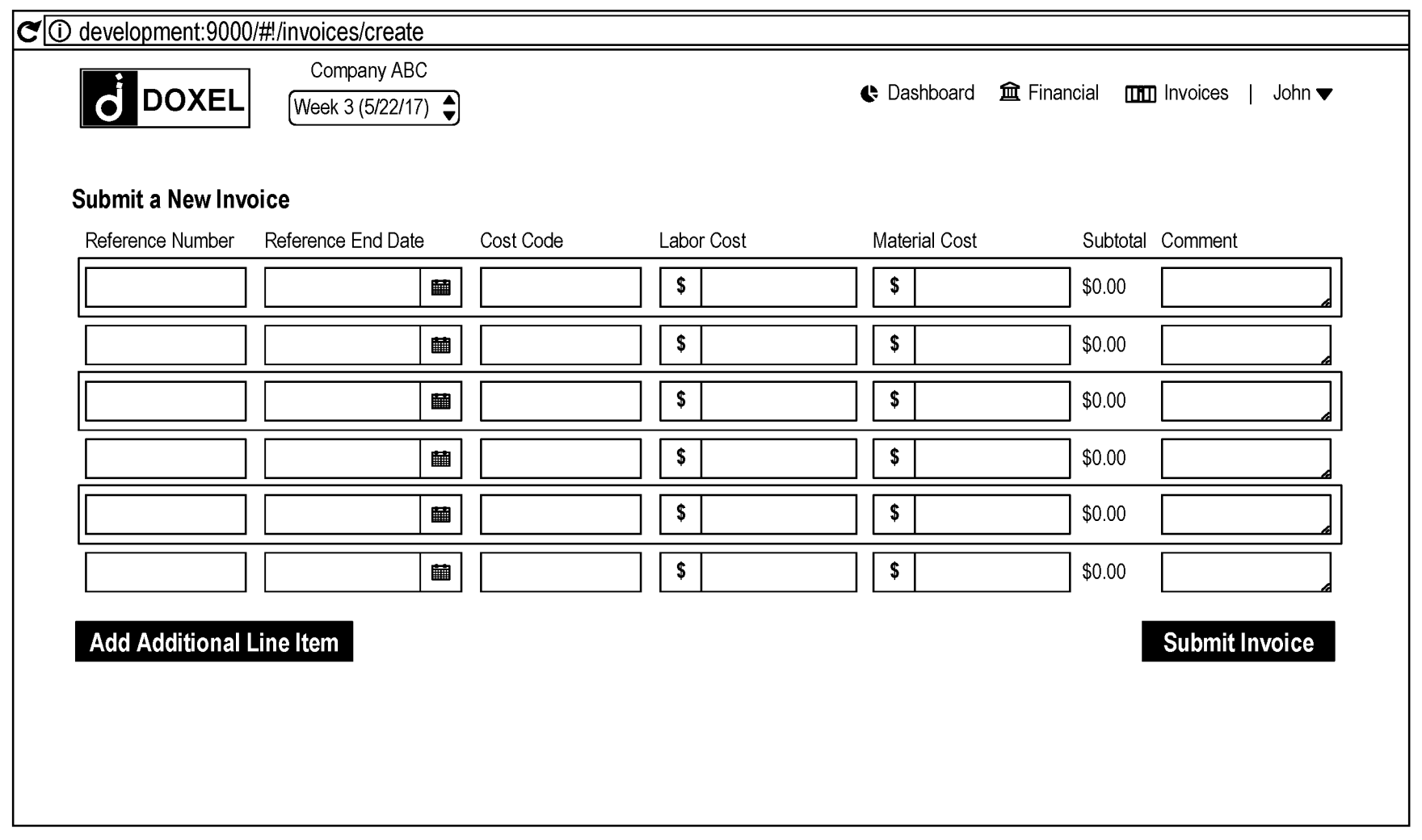
Figure 13B:
Figure 14:
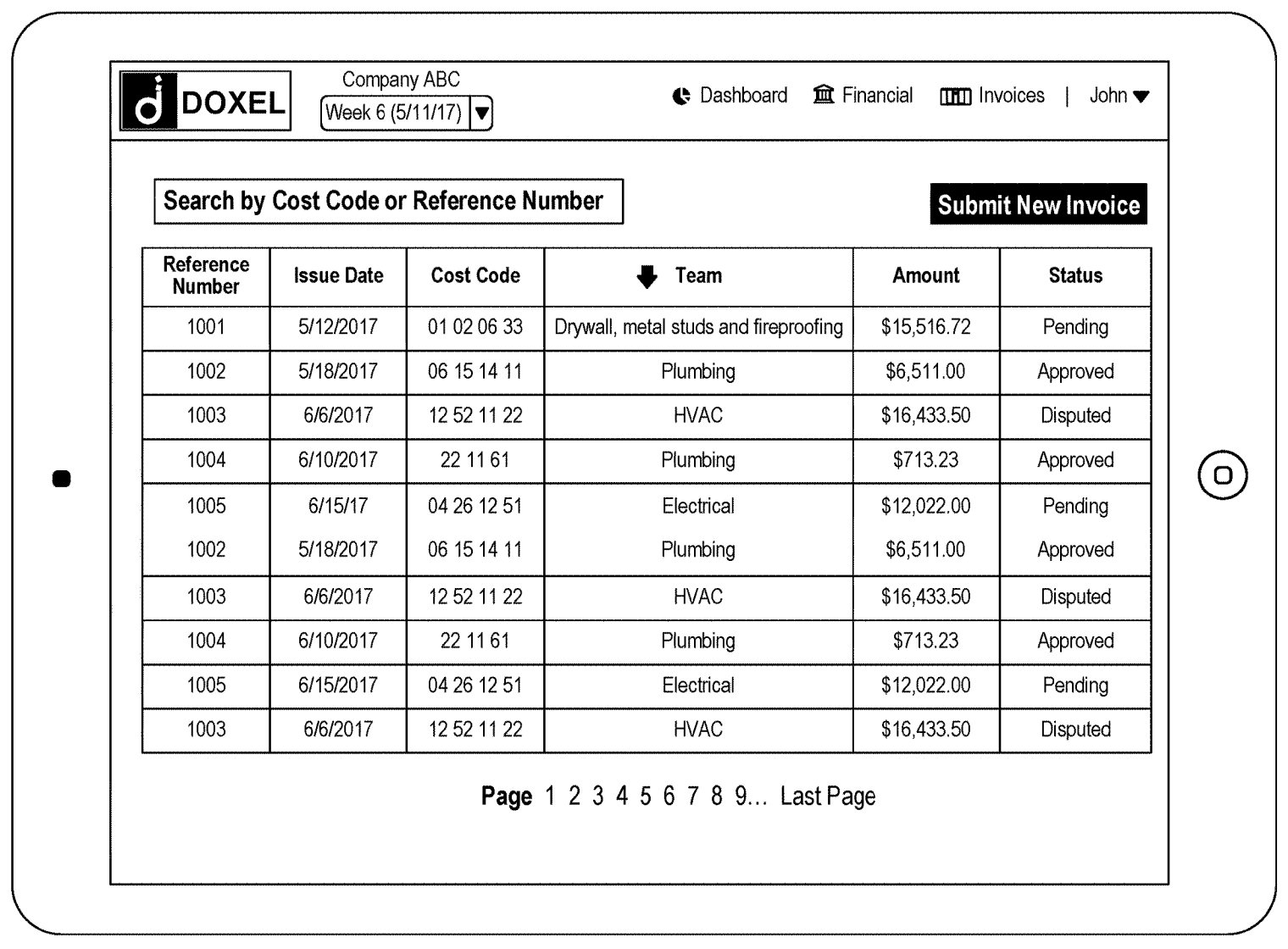

FIGS. 12 and 14 are illustrations of an application running on a mobile device that enables a user, such as a project manager, to review invoice-related data. A project manager can use the application of FIG. 12 or 14 to decide to forego payment of an invoice received from a sub-contractor for completion of a milestone when the completed work includes errors, as detected by the disclosed technique. FIG. 15 is an illustration of an application running on a mobile device that enables a user, such as a project manager, to review budget-related data. FIGS. 13A and B are illustrations of an application running on a mobile device that enables a user, such as a sub-contractor, to submit a new invoice. FIG. 16 is an illustration of an application running on a mobile device that enables a user, such as a project manager, to invite a user, such as a sub-contractor, to access data of the application, such as budget or invoice data, or to utilize the application.

At block 240, the computer system estimates a schedule for completion of a project milestone or other relevant task, and at block 245 the computer system estimates a cost for completion of the project milestone or other relevant task. To facilitate estimation of a schedule impact or cost impact due to an error, a recurrent neural network (RNN) can be used. While a RNN is used in this example, any type of machine learning system or the like can be utilized by the technique. Dynamic temporal behavior of a RNN can be leveraged to determine how much of completed construction may need to be modified or removed and reconstructed in order to fix an error. The computer system can estimate, based on the RNN, the schedule and cost impacts due to having to modify or remove and reconstruct a portion of the completed construction in order to rectify the error. The computer system can compare the estimated schedule or cost to a reference schedule or cost, and can flag discrepancies above a certain threshold.

Figure 10:
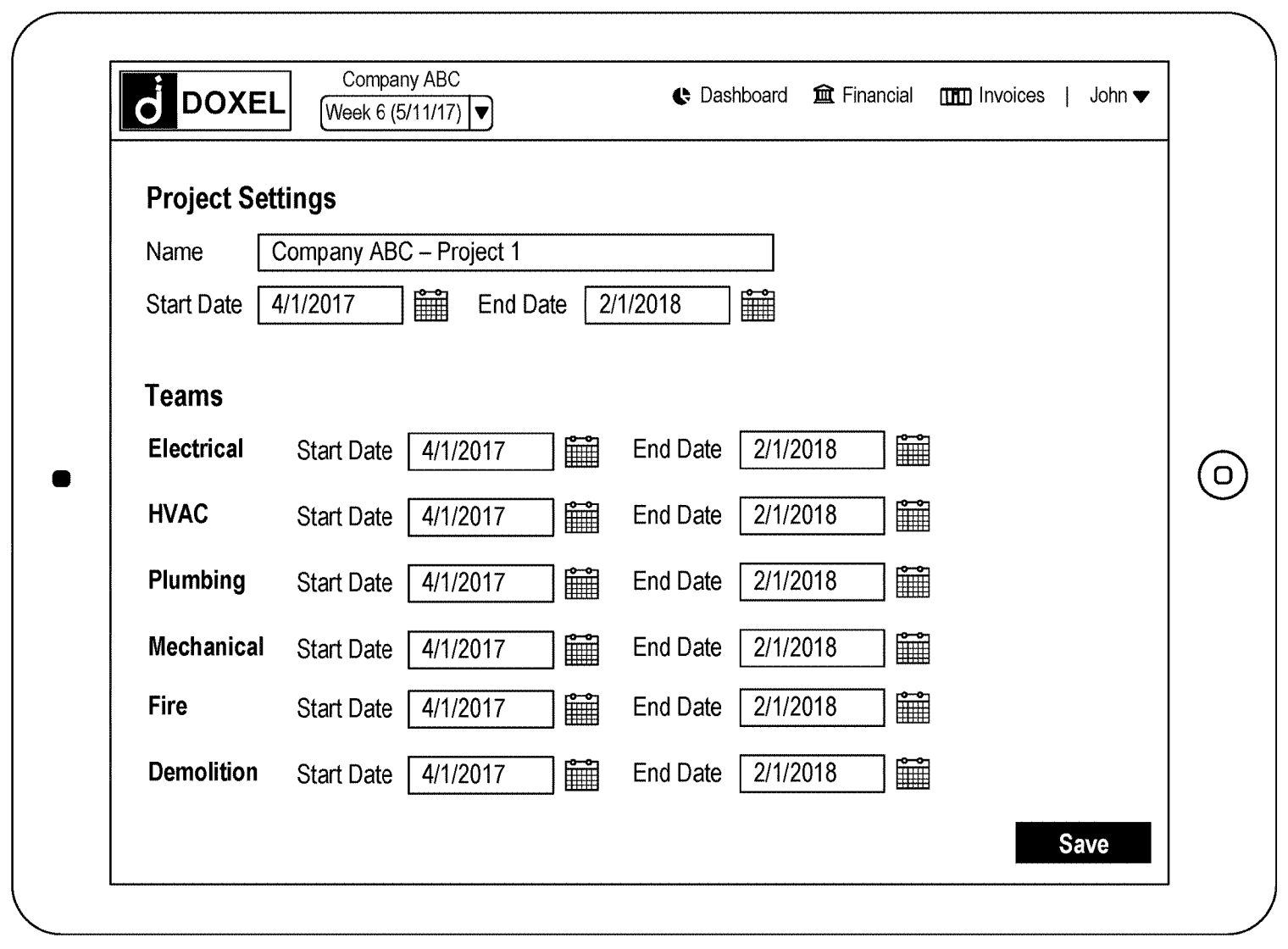
Figure 11:
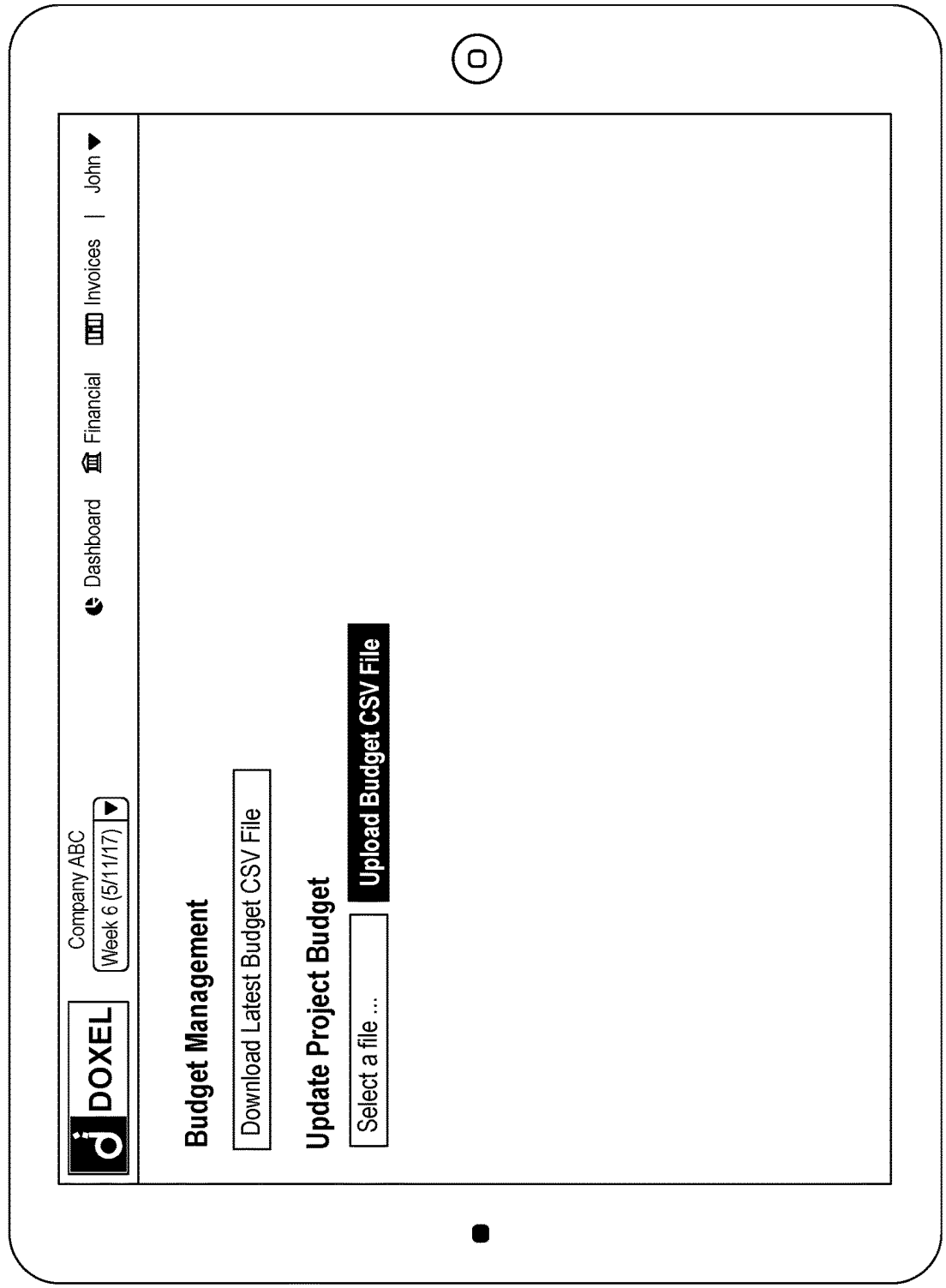
FIG. 11 is an illustration of an application running on a mobile device that enables a user to download and upload project-related files, consistent with various embodiments.

For example, FIGS. 9 and 11 are illustrations of an application running on a mobile device that enables a user to set upload various project-related files, such as a budget csv file. The budget csv file of the example includes one or more reference budgets and includes a cross reference to one or more project milestones. The computer system can compare the schedule or cost estimate to a reference schedule or budget, and can flag a discrepancy that is above a certain threshold. In some embodiments, reference schedule data is input directly by use of an application. For example, FIG. 10 is an illustration of an application running on a mobile device that enables a user to customize project settings, such as a reference schedule completion date for a particular project milestone. Examples of project milestones include the completion of electrical, HVAC, etc. for the building.

Figure 6:
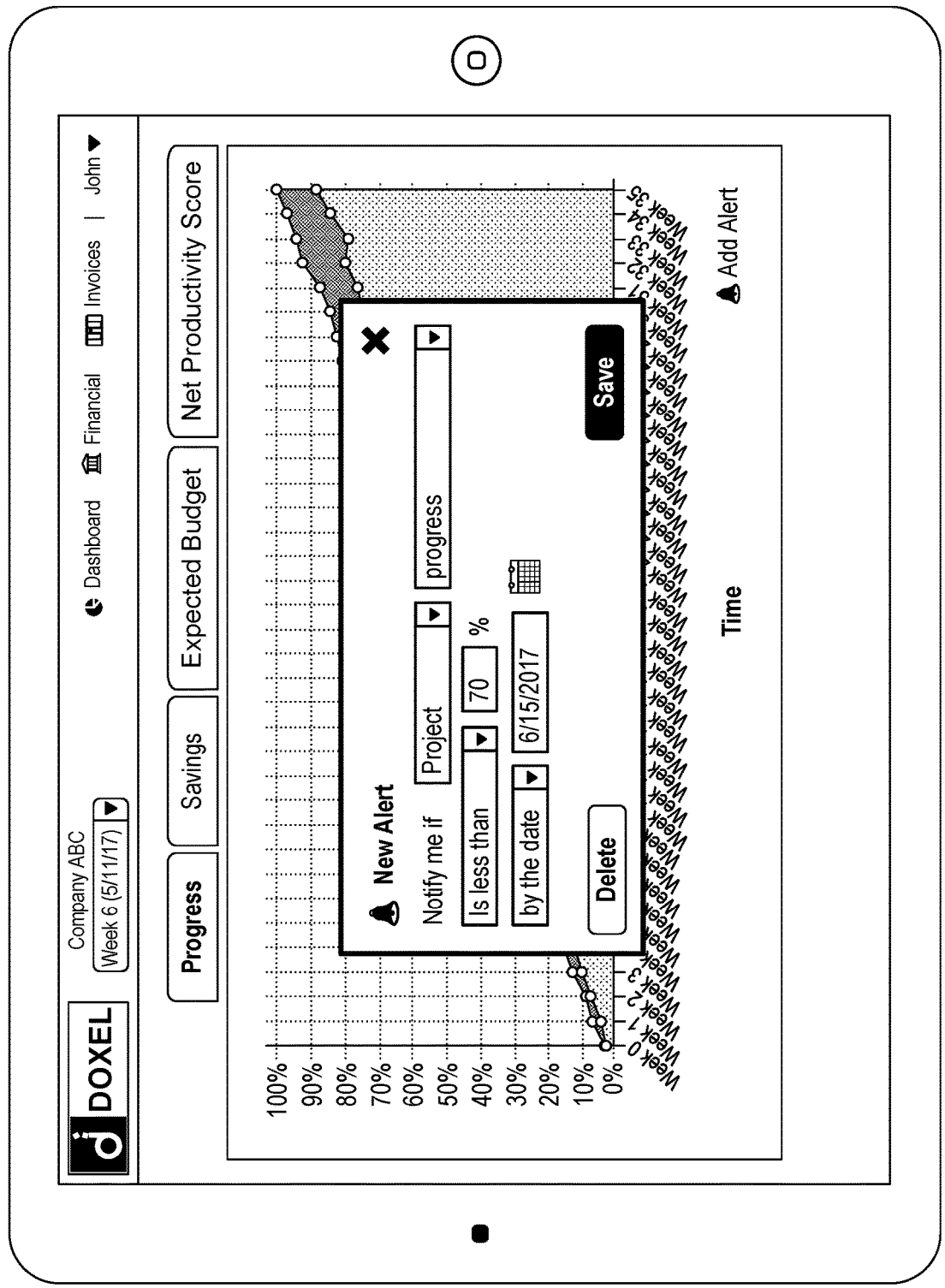
FIG. 6 is an illustration of an application running on a mobile device that enables a user to set an alert, consistent with various embodiments.

The computer system can also monitor various aspects related to the progress, schedule, or cost. For example, the computer system can detect when an estimated progress, schedule, cost, productivity, efficiently, etc. related to the project meets a criteria. For example, FIG. 6 is an illustration of an application running on a mobile device that enables a user to set an alert, such as an alert that triggers if project progress is below a certain threshold as of a certain date, among others.

In an example, a carpentry contractor installs a wall that includes an opening that is one eighth of an inch too small for a window frame that will be installed in the opening. If undetected, the error may not be caught until after subsequent work occurs. For example, the error may not be caught until after the window frame arrives at the construction site and a crew attempts to install the window frame and determines that the window frame will not fit in the wall opening. During the time between completion of the wall opening and detection of the error, subsequent work of installing electrical wiring, plumbing, and insulation in the wall, sheetrocking the wall, and taping the sheetrock occurs. In order to fix the error, some or all of this completed subsequent work may need to be modified or removed and reinstalled, resulting in a significant schedule and cost impacts.

With the disclosed technique, the discrepancy can be detected before any subsequent work occurs. Because the discrepancy is detected early and is determined the be an error that requires additional work to fix, the schedule and cost impact related to the error can be reduced. For example, when the computer system determines that there is an error, the computer system can notify project managers. The project managers can take steps to prevent any subsequent work from being done, resulting in a reduction in the amount of labor needed to fix the error and a corresponding reduction in the schedule and cost impacts related to fixing the error. Also as a result of the discrepancy being detected early and being determined the be an error, progress status, schedule, or cost estimates have improved accuracy as compared to current techniques. Because the error is detected early, progress status estimates do not give credit for completed work that includes an error, resulting in an improved accuracy progress status estimates. Further, schedule and cost estimates can include the cost and schedule impacts that result from having to fix the error, resulting in improved accuracy schedule and cost estimates.

Figure 3:
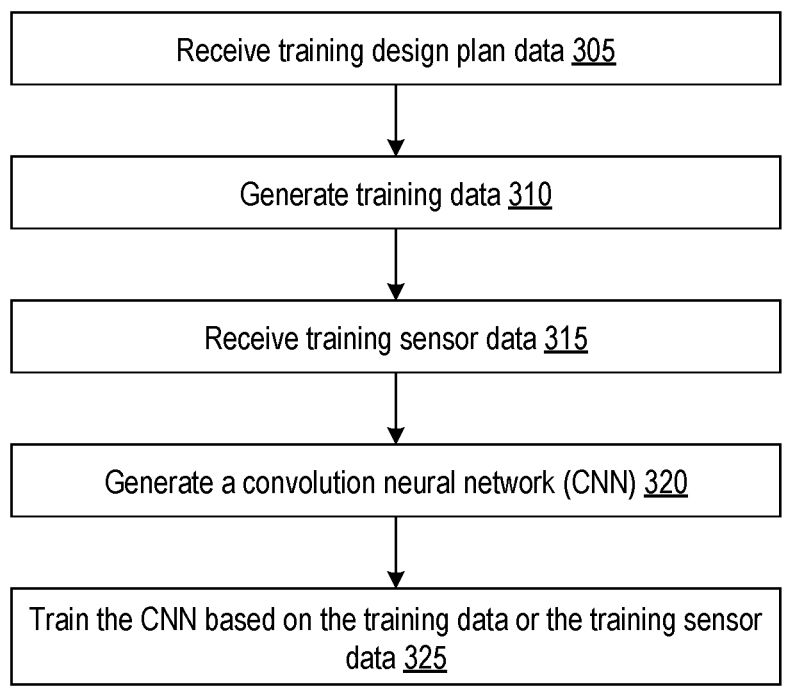
FIG. 3 is a flow diagram illustrating an example process of training a neural network, consistent with various embodiments.

FIG. 3 is a flow diagram illustrating an example process of training a neural network, consistent with various embodiments. Neural networks, including some techniques for generating, training, and using neural networks, are well known in the art, as is evidenced by the previously cited references. At block 305, a computer system receives design plan data for training a neural network, such as a CNN. While a neural network is used in this example, any type of machine learning system or the like can be utilized by the technique. The design plan data can include 2D or 3D data, among others, and can be used as a reference for training the neural network. For example, the design plan data can include design plan data related to one or more structures, such as buildings, airplanes, ships, submarines, space vehicles, etc., as well as data related to an environment related to the structure, such as a landscape, a basketball court, a parking structure, a structure for supporting a ship or submarine, etc. The design plan data can further include labeled components, where each label provides a reference identification of a component of the design plan data. For example, the design plan data can include data associated with a component, such as a pipe. The design plan data includes data from which physical properties associated with a component can be determined, such as architectural drawing data of a pipe from which physical dimensions of the pipe, the material of the pipe, the thickness of the material of the piper, etc., can be determined. The design plan data can additionally include data that identifies the component, such as a label associated with the pipe data that identifies the pipe (e.g., pipe XYZ from vendor ABC).

In an example, a CNN is to be generated and trained in preparation for use in identifying components of a building, where the data to be analyzed by the CNN is based on scans of the building, such as sensor data obtained by LIDAR device while scanning the building, or from sensor data obtained by an imaging device while taking images of the building. Training a neural network involves feeding the neural network sufficient data to enable the network to start recognizing patterns. The patterns that are desirable for the neural network to recognize include, for example, components of the design plan data.

In preparation for training the CNN, a computer system receives design plan data (block 305). The design plan data of this example includes data related to one or more reference buildings, such as design plan data for a portion or all of the one or more reference buildings, for an environment related to the one or more reference buildings, etc. At block 310, the computer system generates data for training a neural network, such as by reading in the design plan data, processing the data, and generating data in one or more formats that are useful for training the neural network.

In an example where the sensor devices are a LIDAR device and an imaging device, the formats that are useful for training the CNN include 3D point data, the format generated by the LIDAR device, and mpeg4 data, the format generated by the imaging device. The computer system, based on the design plan data, generates 3D point data and mpeg4 data that correspond to the one or more reference buildings. For example, the computer system generates 3D point data and mpeg4 data similar to the 3D point data and mpeg4 data that would be generated by a LIDAR device and an imaging device based on scans of a building that matched the design plan data, such as a building constructed based on the design plan data. In some embodiments, the formats that are useful for training a neural network are, rather than the format generated by a sensor, the format read in and analyzed by the CNN. For example, the sensor data may be pre-processed and a derived format generated before being analyzed by the CNN. In such an example, the format that is useful for training the CNN may be the derived format.

The computer system further generates reference labels of components of the design plan data in a format that can useful for training the CNN. The design plan data can include, for example, data that identifies components, such as labels that are associated with the components. For example, the design plan data can include architectural drawing data that define a pipe, and can further include data that identifies the pipe, such as a label with the value "pipe" that is attached to the architectural drawing of the pipe.

In some embodiments, the training data further includes data derived from sensor data. Such training data may be obtained based on sensor scans of one or more reference buildings. In an example where the sensors include a LIDAR device and an imaging device, the sensor data includes 3D point data generated by the LIDAR device and mpeg4 data generated by the imaging device based on sensor scans of a building. Because the sensor data is to be used for training a neural network, the computer system further receives identification data that identifies some or all of the components of the sensor data. For example, the identification data can identify the 3D point data associated with a pipe and can identify the pipe, such as by a label with the value "pipe" that is associated with the 3D point data associated with the pipe. As another example, the identification data can identify the mpeg4 data associated with a beam and can identify the beam, such as by a label with the value "beam" that is associated with the mpeg4 data associated with the beam.

At block 320, the computer system generates a neural network, such as a CNN. At block 325, the neural network is trained based on the training data or the training sensor data. In an example, a CNN is trained based on the training data and the training sensor data. By inputting the training data and the training sensor data, along with the associated identifications of the components of the training data and the training sensor data, the CNN begins to recognize patterns. With sufficient training, the CNN begins to recognize components of the building. With more training, which can occur over the life of the CNN, the ability of the CNN to recognize components improves.

Figure 17:
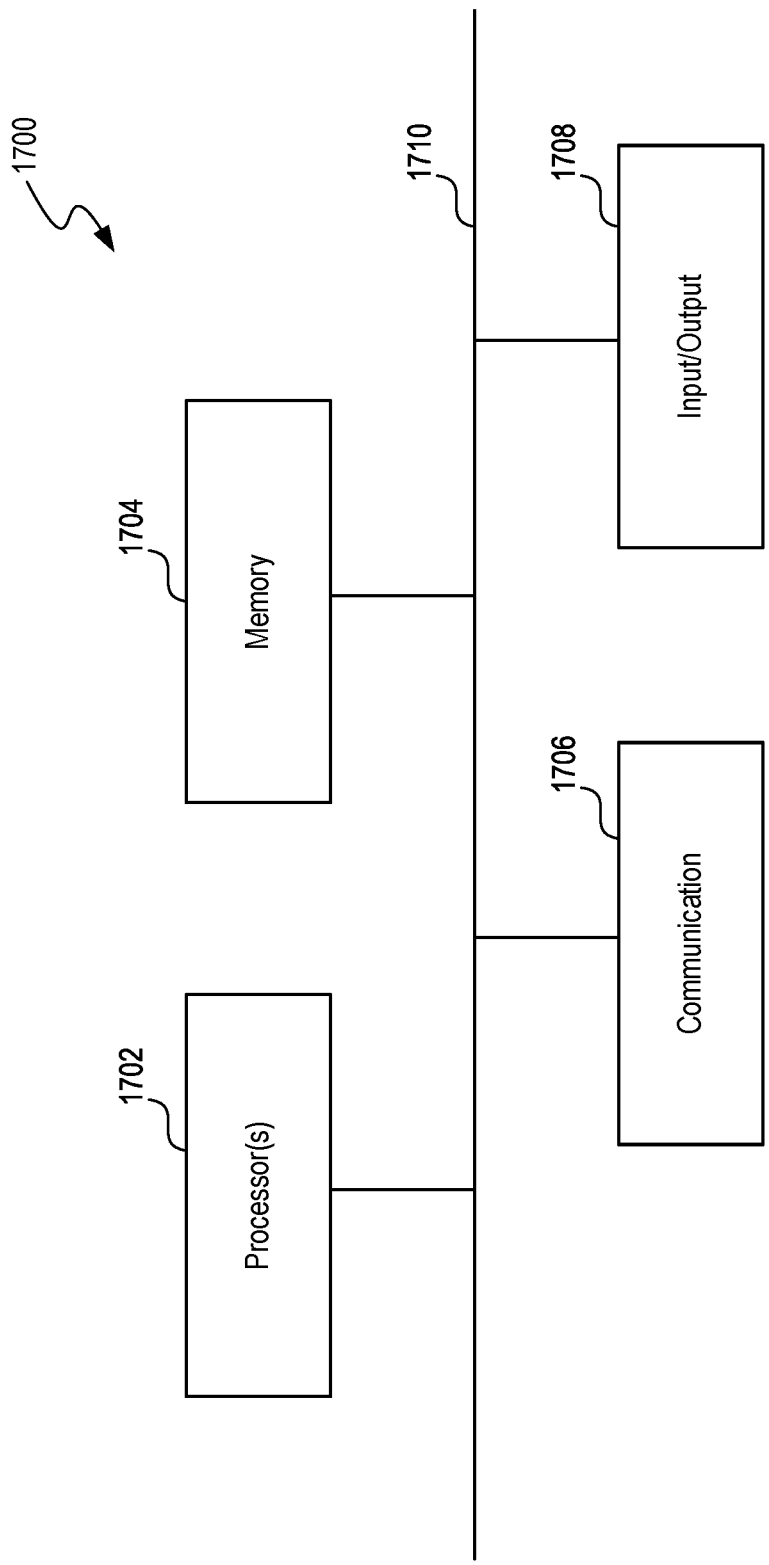
FIG. 17 is a block diagram illustrating an example of a processing system in which at least some operations described herein can be implemented, consistent with various embodiments.

FIG. 17 is a high-level block diagram illustrating an example of a processing system in which at least some operations described herein can be implemented, consistent with various embodiments. The processing system can be processing device 1700, which represents a system that can run any of the methods/algorithms described above. For example, processing device 1700 can be computer system 135, or can be a processing device included in robot 110, LIDAR 115, or imaging device 120, among others. A system may include two or more processing devices such as represented in FIG. 17, which may be coupled to each other via a network or multiple networks. A network can be referred to as a communication network.

In the illustrated embodiment, the processing device 1700 includes one or more processors 1702, memory 1704, a communication device 1706, and one or more input/output (I/O) devices 1708, all coupled to each other through an interconnect 1710. The interconnect 1710 may be or include one or more conductive traces, buses, point-to-point connections, controllers, adapters and/or other conventional connection devices. Each of the processors 1702 may be or include, for example, one or more general-purpose programmable microprocessors or microprocessor cores, microcontrollers, application specific integrated circuits (ASICs), programmable gate arrays, or the like, or a combination of such devices. The processor(s) 1702 control the overall operation of the processing device 1700. Memory 1704 may be or include one or more physical storage devices, which may be in the form of random access memory (RAM), read-only memory (ROM) (which may be erasable and programmable), flash memory, miniature hard disk drive, or other suitable type of storage device, or a combination of such devices. Memory 1704 may store data and instructions that configure the processor(s) 1702 to execute operations in accordance with the techniques described above. The communication device 1706 may be or include, for example, an Ethernet adapter, cable modem, Wi-Fi adapter, cellular transceiver, Bluetooth transceiver, or the like, or a combination thereof. Depending on the specific nature and purpose of the processing device 1700, the I/O devices 1708 can include devices such as a display (which may be a touch screen display), audio speaker, keyboard, mouse or other pointing device, microphone, camera, etc.

While processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations, or may be replicated (e.g., performed multiple times). Each of these processes or blocks may be implemented in a variety of different ways. In addition, while processes or blocks are at times shown as being performed in series, these processes or blocks may instead be performed in parallel, or may be performed at different times. When a process or step is "based on" a value or a computation, the process or step should be interpreted as based at least on that value or that computation.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM); random access memory (RAM); magnetic disk storage media; optical storage media; flash memory devices; etc.), etc.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described, but can be practiced with modification and alteration within the spirit and scope of the appended claims. Accordingly, the specification and drawings are to be regarded in an illustrative sense rather than a restrictive sense.

Physical and functional components (e.g., devices, engines, modules, and data repositories, etc.) associated with processing device 1700 can be implemented as circuitry, firmware, software, other executable instructions, or any combination thereof. For example, the functional components can be implemented in the form of special-purpose circuitry, in the form of one or more appropriately programmed processors, a single board chip, a field programmable gate array, a general-purpose computing device configured by executable instructions, a virtual machine configured by executable instructions, a cloud computing environment configured by executable instructions, or any combination thereof. For example, the functional components described can be implemented as instructions on a tangible storage memory capable of being executed by a processor or other integrated circuit chip. The tangible storage memory can be computer readable data storage. The tangible storage memory may be volatile or non-volatile memory. In some embodiments, the volatile memory may be considered "non-transitory" in the sense that it is not a transitory signal. Memory space and storages described in the figures can be implemented with the tangible storage memory as well, including volatile or non-volatile memory.

Each of the functional components may operate individually and independently of other functional components. Some or all of the functional components may be executed on the same host device or on separate devices. The separate devices can be coupled through one or more communication channels (e.g., wireless or wired channel) to coordinate their operations. Some or all of the functional components may be combined as one component. A single functional component may be divided into sub-components, each sub-component performing separate method step or method steps of the single component.

In some embodiments, at least some of the functional components share access to a memory space. For example, one functional component may access data accessed by or transformed by another functional component. The functional components may be considered "coupled" to one another if they share a physical connection or a virtual connection, directly or indirectly, allowing data accessed or modified by one functional component to be accessed in another functional component. In some embodiments, at least some of the functional components can be upgraded or modified remotely (e.g., by reconfiguring executable instructions that implements a portion of the functional components). Other arrays, systems and devices described above may include additional, fewer, or different functional components for various applications.

Aspects of the disclosed embodiments may be described in terms of algorithms and symbolic representations of operations on data bits stored in memory. These algorithmic descriptions and symbolic representations generally include a sequence of operations leading to a desired result. The operations require physical manipulations of physical quantities. Usually, though not necessarily, these quantities take the form of electric or magnetic signals that are capable of being stored, transferred, combined, compared, and otherwise manipulated. Customarily, and for convenience, these signals are referred to as bits, values, elements, symbols, characters, terms, numbers, or the like. These and similar terms are associated with physical quantities and are merely convenient labels applied to these quantities.

While embodiments have been described in the context of fully functioning computers, those skilled in the art will appreciate that the various embodiments are capable of being distributed as a program product in a variety of forms and that the disclosure applies equally, regardless of the particular type of machine or computer-readable media used to actually effect the embodiments.

The invention claimed is:

1. A method for monitoring construction of a building, the method comprising:

receiving, by a computer system, training data that includes three dimensional training point data that corresponds to a plurality of objects associated with a training building and that includes image data that corresponds to a plurality of images of the objects associated with the training building,
wherein each point of the three dimensional training point data represents a three dimensional coordinate that corresponds to a surface point of one of the objects associated with the training building, and
wherein the training data includes data that identifies and labels the objects including a structural component and a plumbing component associated with the training building;

generating a convolution neural network, by the computer system;

training the convolution neural network, by the computer system, based on the training data and the data that identifies and labels the objects including the structural component and the plumbing component;

receiving, by the computer system, building object data that includes three dimensional point data after a LIDAR system scans objects associated with a building under construction to determine the three dimensional point data;

receiving, by the computer system, building object image data that corresponds to images of the objects associated with the building after an imaging device acquires the images of the objects associated with the building;

analyzing, by the computer system, by use of the convolution neural network, the building object data and the building object image data to identify the objects associated with the building and to determine physical properties of the objects associated with the building;

receiving, by the computer system, building design data that represents physical design plans associated with the building;

determining a mapping, by the computer system, of the objects associated with the building to objects associated with the physical design plans of the building;

comparing, by the computer system, physical properties of the objects associated with the building to physical properties of the objects associated with the physical design plans of the building;

based on the comparison, detecting, by the computer system, a discrepancy in an installation of a primary object based on a difference between a physical property of the primary object associated with the building and a corresponding physical property of a corresponding object associated with the physical design plans of the building;

determining that the discrepancy exceeds a predetermined threshold indicating that the discrepancy constitutes a reportable error; and in response to determining that the discrepancy constitutes a reportable error:
determining a secondary object for removal or modification to compensate for the discrepancy in an installation of the primary object,
wherein the secondary object is different from the primary object, and
adjusting a schedule for construction and a cost estimate to compensate for an impact of the discrepancy in the installation of the primary object and to compensate for the removal or modification of the secondary object, and
sending a message, by the computer system, that indicates the discrepancy in an installation of the primary object.

2. The method of claim 1,
wherein the training data is data derived from design data output by a computer-aided design (CAD) application that was used to capture physical design data associated with the training building,
wherein the data that identifies the objects associated with the training building are data that was input by use of the CAD application and that labels the objects associated with the training building,
wherein physical properties of a first object of the objects associated with the building include any of a dimension of the first object, a shape of the first object, a color of the first object, a surface texture of the first object, or a location of the first object,
wherein physical properties of a second object of the objects associated with the physical design plans of the building include any of a dimension of the second object, a shape of the second object, a color of the second object, a surface texture of the second object, or a location of the second object,
wherein the first object or the second object are any of a pipe, a beam, a wall, a floor, a ceiling, a toilet, a roof, a door, a door frame, a metal stud, a wood stud, a light fixture, a piece of sheetrock, a water heater, an air conditioner unit, a water fountain, a cabinet, a table, a desk, a refrigerator, or a sink,
wherein the imaging device is a camera, a video camera, or a mobile device,
wherein the building design data are design data output by the CAD application, and
wherein the physical design plans of the building were captured by use of the CAD application.

3. The method of claim 2,
wherein the CAD application is AutoCAD from Autodesk, Inc. or MicroStation from Bentley Software, Inc., and
wherein the mobile device is any one of a smart phone, a tablet computer, a portable media device, a wearable device, or a laptop computer.

4. The method of claim 1, wherein the discrepancy indicates that a pipe is located in an incorrect location, the method further comprising, prior to sending the message that indicates the discrepancy:
receiving data that represents the schedule for construction of the building;
determining, based on the received building object data, that causing the pipe to be located in a correct location will cause the schedule for the construction of the building to be delayed; and
sending a message that indicates that the construction of the building will be delayed.

5. The method of claim 1, wherein the discrepancy is determined based on sensor data obtained by an image capture device while capturing an image of the building.

6. The method of claim ,1 wherein the discrepancy is determined based on sensor data obtained by a sonar device while capturing a sonar image of the building.

7. The method of claim 1, wherein the discrepancy is determined based on sensor data obtained by a radar system while capturing a radar image of the building.

8. The method of claim 1, further comprising, prior to sending the message that indicates the discrepancy:
  receiving data that correlates to the schedule for construction of the building;
  determining, based on the received sensor data, that fixing the discrepancy will cause the schedule for the construction of the building to be delayed; and
  sending a message that indicates that fixing the discrepancy will cause the schedule for the construction of the building to be delayed.

9. The method of claim 1, wherein the discrepancy is a difference above a predetermined threshold in a dimension of the primary object and a corresponding dimension of the corresponding object.

10. The method of claim 1, wherein the discrepancy is a difference in color of a portion of the primary object and a color of a corresponding portion of the corresponding object.

11. The method of claim 1, wherein the discrepancy is a difference above a predetermined threshold of a location of the primary object and a location of the corresponding object.

12. The method of claim 1, wherein the labeled and identified objects include an electrical component in addition to the structural component and the plumbing component.

13. A computing system comprising:
  at least one hardware processor; and
  at least one non-transitory memory storing instructions, which, when executed by the at least one hardware processor, cause the computing system to:
  receive training data that includes three dimensional training point data that corresponds to a plurality of objects associated with a training building and that includes image data that corresponds to a plurality of images of the objects associated with the training building,
    wherein each point of the three dimensional training point data represents a three dimensional coordinate that corresponds to a surface point of one of the objects associated with the training building, and
    wherein the training data includes data that identifies and labels the objects including a structural component and a plumbing component associated with the training building;
  generate a convolution neural network;
  train the convolution neural network based on the training data and the data that identifies and labels the objects including the structural component and the plumbing component;
  receive building object data that includes three dimensional point data after a LIDAR system scans objects associated with a building under construction to determine the three dimensional point data;
  receive building object image data that corresponds to images of the objects associated with the building after an imaging device acquires the images of the objects associated with the building;
  analyze by use of the convolution neural network, the building object data and the building object image data to identify the objects associated with the building and to determine physical properties of the objects associated with the building;
  receive building design data that represents physical design plans associated with the building;
  determine a mapping of the objects associated with the building to objects associated with the physical design plans of the building;
  compare physical properties of the objects associated with the building to physical properties of the objects associated with the physical design plans of the building;
  based on the comparison, detect a discrepancy in an installation of a primary object based on a difference between a physical property of the primary object associated with the building and a corresponding physical property of a corresponding object associated with the physical design plans of the building;
  determine that the discrepancy exceeds a predetermined threshold indicating that the discrepancy constitutes a reportable error; and
  in response to the determination that the discrepancy constitutes a reportable error:
  determine a secondary object for removal or modification to compensate for the discrepancy in an installation of the primary object,
    wherein the secondary object is different from the primary object, and
  adjust a schedule for construction and a cost estimate to compensate for an impact of the discrepancy in the installation of the primary object and to compensate for the removal or modification of the secondary object, and
  send a message that indicates the discrepancy in an installation of the primary object.

14. The computing system of claim 13,
  wherein the training data is data derived from design data output by a computer-aided design (CAD) application that was used to capture physical design data associated with the training building,
  wherein the data that identifies the objects associated with the training building are data that was input by use of the CAD application and that labels the objects associated with the training building,
  wherein physical properties of a first object of the objects associated with the building include any of a dimension of the first object, a shape of the first object, a color of the first object, a surface texture of the first object, or a location of the first object,
  wherein physical properties of a second object of the objects associated with the physical design plans of the building include any of a dimension of the second object, a shape of the second object, a color of the second object, a surface texture of the second object, or a location of the second object,
  wherein the first object or the second object are any of a pipe, a beam, a wall, a floor, a ceiling, a toilet, a roof, a door, a door frame, a metal stud, a wood stud, a light fixture, a piece of sheetrock, a water heater, an air conditioner unit, a water fountain, a cabinet, a table, a desk, a refrigerator, or a sink,
  wherein the imaging device is a camera, a video camera, or a mobile device,
  wherein the building design data are design data output by the CAD application, and
  wherein the physical design plans of the building were captured by use of the CAD application.

15. The computing system of claim 13, wherein the discrepancy indicates that a pipe is located in an incorrect location, the computing system being further caused to, prior to sending the message that indicates the discrepancy:
  receive data that represents the schedule for construction of the building;

determine, based on the received building object data, that causing the pipe to be located in a correct location will cause the schedule for the construction of the building to be delayed; and send a message that indicates that the construction of the building will be delayed.

16. A computer-readable storage medium, excluding transitory signals and carrying instructions, which, when executed by at least one data processor of a system, cause the system to:

receive training data that includes three dimensional training point data that corresponds to a plurality of objects associated with a training building and that includes image data that corresponds to a plurality of images of the objects associated with the training building,
wherein each point of the three dimensional training point data represents a three dimensional coordinate that corresponds to a surface point of one of the objects associated with the training building, and
wherein the training data includes data that identifies and labels the objects including a structural component and a plumbing component associated with the training building;

generate a convolution neural network;

train the convolution neural network based on the training data and the data that identifies and labels the objects including the structural component and the plumbing component;

receive building object data that includes three dimensional point data after a LIDAR system scans objects associated with a building under construction to determine the three dimensional point data;

receive building object image data that corresponds to images of the objects associated with the building after an imaging device acquires the images of the objects associated with the building;

analyze by use of the convolution neural network, the building object data and the building object image data to identify the objects associated with the building and to determine physical properties of the objects associated with the building;

receive building design data that represents physical design plans associated with the building;

determine a mapping of the objects associated with the building to objects associated with the physical design plans of the building;

compare physical properties of the objects associated with the building to physical properties of the objects associated with the physical design plans of the building;

based on the comparison, detect a discrepancy in an installation of a primary object based on a difference between a physical property of the primary object associated with the building and a corresponding physical property of a corresponding object associated with the physical design plans of the building;

determine that the discrepancy exceeds a predetermined threshold indicating that the discrepancy constitutes a reportable error; and in response to the determination that the discrepancy constitutes a reportable error:
determine a secondary object for removal or modification to compensate for the discrepancy in an installation of the primary object,
wherein the secondary object is different from the primary object, and
adjust a schedule for construction and a cost estimate to compensate for an impact of the discrepancy in the installation of the primary object and to compensate for the removal or modification of the secondary object, and
send a message that indicates the discrepancy in an installation of the primary object.

17. The computer-readable storage medium of claim 16, wherein the discrepancy is determined based on sensor data obtained by an image capture device while capturing an image of the building.

18. The computer-readable storage medium of claim 16, wherein the discrepancy is determined based on sensor data obtained by a sonar device while capturing a sonar image of the building.

19. The computer-readable storage medium of claim 16, wherein the discrepancy is determined based on sensor data obtained by a radar system while capturing a radar image of the building.

20. The computer-readable storage medium of claim 16, wherein the system is further caused to, prior to sending the message that indicates the discrepancy:
receive data that correlates to the schedule for construction of the building;
determine, based on the received sensor data, that fixing the discrepancy will cause the schedule for the construction of the building to be delayed; and
send a message that indicates that fixing the discrepancy will cause the schedule for the construction of the building to be delayed.

21. The computer-readable storage medium of claim 16, wherein the discrepancy is a difference above a predetermined threshold in a dimension of the primary object and a corresponding dimension of the corresponding object, or of a location of the primary object and a location of the corresponding object.

22. The computer-readable storage medium of claim 16, wherein the discrepancy is a difference in color of a portion of the primary object and a color of a corresponding portion of the corresponding object.

* * * * *